(12) United States Patent
Takada et al.

(10) Patent No.: US 6,809,588 B2
(45) Date of Patent: Oct. 26, 2004

(54) DISTORTION COMPENSATION CIRCUIT

(75) Inventors: Toshio Takada, Tokyo (JP); Yoichi Okubo, Tokyo (JP); Masaki Suto, Tokyo (JP); Masato Horaguchi, Tokyo (JP); Naoki Hongo, Tokyo (JP)

(73) Assignee: Hitachi Kokusai Electric Inc., Tokyo (JP)

(*) Notice: Subject to any disclaimer, the term of this patent is extended or adjusted under 35 U.S.C. 154(b) by 85 days.

(21) Appl. No.: 10/253,972

(22) Filed: Sep. 25, 2002

(65) Prior Publication Data

US 2003/0085762 A1 May 8, 2003

(30) Foreign Application Priority Data

Sep. 27, 2001 (JP) ........................................ 2001-296812
Sep. 27, 2001 (JP) ........................................ 2001-297632

(51) Int. Cl.[7] ............................................. H03F 1/26
(52) U.S. Cl. ...................................... 330/149; 330/136
(58) Field of Search ................................ 330/149, 136, 330/129; 375/297; 327/307; 455/63

(56) References Cited

U.S. PATENT DOCUMENTS

| | | | |
|---|---|---|---|
| 3,900,823 A | * | 8/1975 | Sokal et al. .................. 330/149 |
| 4,329,655 A | | 5/1982 | Nojima et al. |
| 5,455,538 A | | 10/1995 | Kobayashi et al. |
| 5,606,286 A | | 2/1997 | Bains |
| 6,531,917 B2 | * | 3/2003 | Yamamoto et al. ........... 330/149 |
| 6,590,449 B2 | * | 7/2003 | Matsuura et al. ............. 330/149 |

FOREIGN PATENT DOCUMENTS

EP          1253708          10/2002

OTHER PUBLICATIONS

Noriharu Suematsu, Tomonori Shigematsu, Yoshitada Iyama and Osami Ishidam "Transfer Characteristic of IM3 Relative Phase for a GaAs FET Amplifier", Microwave Symposium Digest, 1997., IEEE MTT–S International Denver, CO, USA 8–13 Jun. 1997, pp. 901–904.

* cited by examiner

Primary Examiner—Henry Choe
(74) Attorney, Agent, or Firm—Bacon & Thomas, PLLC

(57) ABSTRACT

A distortion compensation circuit reduces an unbalance between higher and lower 3rd order distortions, the distortions being generated by an amplifier which amplifies an input signal having at least two frequency components. Amplitude modulation means, which includes an amplitude detector, an amplitude circuit, a phase circuit and another amplitude circuit, generates sideband signals corresponding to an instantaneous phase difference between the higher and lower 3rd order distortions, such that distortions generated by the amplifier can be cancelled. Further, sideband signal generating means, which includes an amplitude circuit, a delay circuit, an AM modulator, another amplitude circuit, another delay circuit and a PM modulator, performs AM and PM on the input signal to thereby generate sideband signals, such that distortions generated by the amplifier can be cancelled.

18 Claims, 18 Drawing Sheets

DISTORTION COMPENSATION CIRCUIT

FIELD OF THE INVENTION

The present invention relates to a distortion compensation circuit for use in an amplifying device; and, more particularly, to a distortion compensation circuit for reducing an unbalance between a higher 3rd order distortion and a lower 3rd order distortion generated by an amplifier of the amplifying device.

BACKGROUND OF THE INVENTION

In general, a distortion is generated in the course of amplifying a signal in an amplifier. Therefore, in a communications device which amplifies a communications signal by using an amplifier, it is needed to cancel a distortion caused in the course of amplifying a signal, e.g., a W-CDMA (wide-banded code division multiple access) signal or a multi-carrier signal, by using the amplifier.

FIG. 1 illustrates, as an amplifying device using a distortion compensation method of the prior art, an example of an amplifying device which cancels a distortion by using a distortion compensation circuit adopting a feed-forward method.

In the amplifying device shown in FIG. 1, an input signal (a main signal) is distributed into two ways at a distributor 41. A distributed signal is amplified by an amplifier (a main amplifier) 42 to thereby be inputted into a subtractor 44, and another distributed signal is inputted into the subtractor 44 through a delay line 43. In the subtractor 44, a distortion component is extracted by deducting the signal inputted from the delay line 43 from the amplified signal inputted from the main amplifier 42. The distortion component is inputted therefrom into a distortion amplifier 45 and the amplified signal, which includes the distortion component, inputted from the main amplifier 42 is outputted to another subtractor 47 through another delay line 46. Further, the distortion component, which is extracted at the subtractor 44, is amplified at the distortion amplifier 45 to thereby be outputted to the subtractor 47. The subtractor 47 generates a final amplified signal without a distortion by deducting the amplified distortion component inputted from the distortion amplifier 45 from the amplified signal, which includes the distortion component, inputted from the delay line 46.

Here, the signal inputted from the delay line 46 to the subtractor 47 is generated by amplifying the input signal in the main amplifier 42 and the signal includes a distortion caused by the main amplifier 42. Further, the signal inputted from the distortion amplifier 45 to the subtractor 47 is generated by amplifying the distortion. Therefore, the output signal from the subtractor 47 is considered to be a signal generated by canceling the distortion caused by the main amplifier 42, i.e., deducting the distortion from the amplified signal generated by the main amplifier 42. Further, each of the distributor 41 and the subtractors 44 and 47 comprises, e.g., a directional coupler.

However, in such an amplifying device as described above, the efficiency in the main amplifier 42 is known to be very poor, since an amplified signal outputted from the main amplifier 42 is attenuated while passing through the subtractor 44, the delay line 46 or subtractor 47, which requires an increase in an output level of the main amplifier 42 in accordance with a required output level of the amplifying device.

Meanwhile, FIG. 2 exhibits an example of an amplifying device having a distortion compensation circuit adopting a pre-distortion method.

The amplifying device of FIG. 2 has a pre-distortion circuit 51 coupled to an input of a main amplifier 52. The pre-distortion circuit 51 generates a pre-distortion before a main signal being generated, a phase of the pre-distortion having a difference of 180° with respect to a distortion (i.e., an opposite phase) and a same amplitude as that of the distortion, the distortion being generated by the main amplifier 52. Therefore, the distortion caused by the main amplifier 52 is canceled by the pre-distortion generated by the pre-distortion circuit 51.

Such an amplifying device can be implemented to obtain a high efficiency since any other circuits are not coupled to an output of the main amplifier 52. However, in this case, the distortion generated by the pre-distortion circuit 51 should have same characteristic as that generated by the main amplifier 52 regardless of the variation or frequency characteristics of an input signal.

Here, it is understood by those skilled in the art that the distortion caused by the main amplifier is due to an AM-AM (amplitude modulation-amplitude modulation) conversion or an AM-PM (amplitude modulation-phase modulation) conversion.

FIG. 3A charts a graph showing an example of the AM-AM conversion performed in the main amplifier. The horizontal and vertical axes of the graph represent an input level and a gain of the main amplifier, respectively. FIG. 3A shows an ideal gain characteristic (G1) together with those (G2 and G3) of the main amplifier and the pre-distortion circuit. As shown in FIG. 3A, the ideal gain characteristic (G1) can be obtained by combining those (G2 and G3) of the main amplifier and the pre-distortion circuit.

Further, FIG. 3B exhibits a graph showing an example of the AM-PM conversion performed in the main amplifier. The horizontal and vertical axes of the graph represent an input level and an output phase of the main amplifier, respectively. FIG. 3B shows an ideal phase characteristic (P1) together with those (P2 and P3) of the main amplifier and the pre-distortion circuit. As shown in FIG. 3B, the ideal phase characteristic (P1) can be obtained by combining those (P2 and P3) of the main amplifier and the pre-distortion circuit.

Referring to FIG. 2, the underlying principle of the pre-distortion now will be described.

In FIG. 2, $\alpha$ represents an instantaneous power of a signal inputted to the pre-distortion circuit 51, $\beta$ represents an instantaneous power of a signal outputted from the pre-distortion circuit 51 and inputted to the main amplifier 52, and $\gamma$ represents an instantaneous power of a signal outputted from the main amplifier 52.

An I/O characteristic of the main amplifier 52 can be expressed like as Equation (1) by using $\beta$ and $\gamma$. Here, A is a vector representing a gain and a phase of a small signal generated by the main amplifier 52, B is a vector representing a gain and a phase of a 3rd order distortion generated by the main amplifier 52, and C is a vector representing a gain and a phase of a 5th order distortion generated by the main amplifier 52. Further, each of A, B, C, a, b, and c, which will be described later, is expressed by a vector, i.e., (gain coefficient, phase coefficient).

$$\gamma = A \cdot \beta + B \cdot \beta^3 + C \cdot \beta^5 \qquad (1)$$

Likewise, an I/O characteristic of the pre-distortion circuit 51 can be expressed like as Equation (2) by using $\alpha$ and $\beta$. Here, a is a vector representing a gain and a phase of a small signal generated by the pre-distortion circuit 51, b is a vector representing a gain and a phase of a 3rd order distortion generated by the pre-distortion circuit 51, and c is a vector representing a gain and a phase of a 5th order distortion generated by the pre-distortion circuit 51.

$$\beta = a \cdot \alpha + b \cdot \alpha^3 + c \cdot \alpha^5 \qquad (2)$$

If β is eliminated by substituting Equation (2) for β in Equation (1), an equation, i.e., Equation (3), showing a relationship between α and γ can be obtained.

$$\gamma = A \cdot a \cdot \alpha + (A \cdot b + B \cdot a^3) \cdot \alpha^3 + \qquad \text{Equation (3)}$$
$$(A \cdot c + 3 \cdot B \cdot a^2 \cdot b + C \cdot a^5) \cdot \alpha^5 + \cdots$$

In the amplifying device as shown in FIG. 2, a distortion canceling can be accomplished by setting each of coefficients for $\alpha^3$ and $\alpha^5$ in Equation (3) to zero, which is expressed by using Equations (4) and (5).

$$A \cdot b + B \cdot a^3 = 0 \qquad (4)$$

$$A \cdot c + 3 \cdot B \cdot a^2 \cdot b + C \cdot a^5 = 0 \qquad \text{Equation (5)}$$

In the pre-distortion circuit 51 as shown in FIG. 2, characteristics satisfying Equations (4) and (5) should be realized. Further, if the conditions expressed in Equations (4) and (5) are satisfied, the amplifying device generates neither 3rd order intermodulation distortion (IM3) nor 5th order intermodulation distortion (IM5).

However, as shown in FIGS. 3A and 3B, characteristics of the AM-AM and the AM-PM conversion are so complicated that the characteristics of the pre-distortion circuit must have a complicated function to implement an amplifying device having the above described ideal characteristics. Therefore, it is so difficult to calculate coefficients of the characteristic functions by using an analog approach.

Accordingly, as an alternative amplifying device having a distortion compensation circuit adopting the pre-distortion method, there has been proposed an amplifying device as shown in FIG. 4.

In the amplifying device of FIG. 4, an input signal, e.g., an RF (radio frequency) signal, is branched by a branch circuit 61. A branch signal is outputted from the branch circuit 61 to a phase circuit 67 through a delay line 62. Another branch signal is outputted from the branch circuit 61 to an amplitude detector (envelope detector) 63.

The amplitude detector 63 detects an amplitude level (envelope level) of the inputted branch signal. Here, a detecting method used by the amplitude detector 63 may be based on, e.g., a square-law detection, but not limited thereto.

And then, the detected amplitude level is converted into a digital signal by an A/D (analog to digital) converter 64. The digital signal is inputted to a table 65a for phase correction and a table 65b for amplitude correction.

The table 65a stores data for the correction of a phase of a signal together with a corresponding amplitude level of the signal. Therefore, when the digitized amplitude level outputted from the A/D converter 64 is inputted to the table 65a, corresponding data for phase correction are read from the table 65a to thereby be outputted to a D/A (digital to analog) converter 66a. The D/A converter 66a converts the data for phase correction into an analog signal, the analog signal being inputted to the phase circuit 67 through an LPF (low pass filter) 73a.

Meanwhile, the table 65b stores data for the correction of an amplitude of a signal together with a corresponding amplitude level of the signal. Therefore, when the digitized amplitude level outputted from the A/D converter 64 is inputted to the table 65b, corresponding data for amplitude correction are read from the table 65b to thereby be outputted to a D/A converter 66b. The D/A converter 66b converts the data for amplitude correction into an analog signal, the analog signal being inputted to an amplitude circuit 68 through an LPF 73b.

The branch signal, which is delivered from the branch circuit 61 to the phase circuit 67 through the delay circuit 62, is synchronized with the data for amplitude and phase correction outputted from the D/A converters 66a and 66b through LPF's 73a and 73b.

Accordingly, in the phase circuit 67, the delayed branch signal inputted from the delay circuit 62 is distorted in its phase by using the data for phase correction from the D/A converter 66a. And then, in the amplitude circuit 68, the phase-distorted signal is distorted in its amplitude by using the data for amplitude correction from the D/A converter 66b.

The amplitude and phase distortion imposed on the delayed branch signal by the phase circuit 67 and the amplitude circuit 68 is subsequently cancelled by amplitude and phase distortion generated by a main amplifier 69. That is, the amplifying device has such a characteristic that AM-AM or AM-PM conversion is performed therein based on an input level thereof. However, as shown in FIGS. 3A and 3B, such a characteristic is cancelled by an opposite characteristic which is generated by the amplitude and phase correction data stored in the tables 65a and 65b, which results in an ideal characteristic of the amplifying device.

The signal amplified by the main amplifier 69 is outputted as a final output signal through another branch circuit 70. Further, in the branch circuit 70, a part of the amplified signal from the main amplifier 69 is branched to a distortion detection circuit 71.

The distortion detection circuit 71 extracts a distortion component remaining in the branch signal from the branch circuit 70 after the distortion canceling, the remaining distortion component being outputted to a table update circuit 72.

The table update circuit 72, based on the distortion component detected by the distortion detection circuit 71, calculates amplitude and phase correction data for further canceling the distortion component remaining in the branch signal from the branch circuit 70. Subsequently, the amplitude and phase correction data are stored into the tables 65a and 65b. In this way, the amplitude and phase correction data stored in the tables 65a and 65b are updated to minimize the amplitude and phase distortion caused by the amplifying device. Further, through the update of the amplitude and phase correction data by using the above described feedback system, the amplifying device can operate in an efficient manner regardless of any effect caused by, e.g., a temperature change or a secular change.

However, the degree of the distortion generated by the main amplifier depends on the frequency of the RF signal, which results in unpredictable characteristics of the distortion.

FIG. 5 shows an example of two output signals and corresponding distortions generated by a main amplifier when two input signals, each of which has a different frequency, e.g., f1 or f2, are inputted to the main amplifier. In FIG. 5, the horizontal and vertical axes represent frequency and amplitude level of the signals, respectively. FIG. 5 charts IM (intermodulation) distortion components, i.e., a lower 3rd order distortion and a higher 3rd order distortion at frequencies of (2·f1−f2) and (2·f2−f1), respectively, wherein f2 is larger than f1 (f2>f1).

As shown in FIG. 5, when the amplitude levels of the two input signals are identical, there is introduced an amplitude difference ΔIM (=B−A) between an amplitude level A of the lower 3rd order distortion and B that of the higher 3rd order distortion at the frequencies of (2·f1−f2) and (2·f2−f1), respectively. In this case, although the pre-distortion circuit of the amplifying device operates in an ideal state, an identical distortion canceling process is performed with respect to the whole range of frequencies, such that a distortion component corresponding to the amplitude difference ΔIM cannot be canceled by such a distortion canceling process.

Further, such an amplitude difference, ΔIM, is caused by a distortion factor other than what the main amplifier has in general. For example, ordinary 3rd order distortion components, which are generated by the main amplifier, have same amplitude levels at the frequencies of (2·f1−f2) and (2·f2−f1), respectively.

Even when the ordinary distortion components, i.e., 3rd order distortion components, can be cancelled by the pre-distortion circuit having characteristics opposite to those of the 3rd order distortion components, ΔIM shown in FIG. 5 cannot be cancelled by the pre-distortion circuit. For example, when A, B and ΔIM are set to be 1.0, 0.8 and 2 dB=0.2, respectively, a distortion component other than the ordinary distortion component becomes 0.1 and the ordinary distortion component becomes {B+(A−B)/2}=0.9. In this case, since the distortion component other than the ordinary distortion component remains after distortion canceling performed by the pre-distortion circuit, the amount of distortion canceling becomes only |20 Log(0.1/0.9)|=19 dB. Further, the larger ΔIM becomes, the smaller the amount of distortion canceling becomes.

Meanwhile, the amplifying device shown in FIG. 1, which has the distortion compensation circuit adopting the feed-forward method, can obtain an amount of distortion canceling of more than 30 dB. Therefore, as for the amount of distortion canceling, the amplifying device using the feed-forward method operates in a more efficient manner than that using the pre-distortion circuit.

There are several factors that cause the amplitude difference ΔIM. For example, a distortion having a difference frequency of (f2−f1) is generated due to an even order distortion caused by a transistor included in the main amplifier, and the input signals having frequencies of f1 and f2 are modulated due to the distortion caused by the transistor. This is one of factors that may cause the amplitude difference ΔIM. Such a distortion becomes more apparent when, as in an AB-class amplifier, the variation of drain current thereof is relatively large. Further, when an input signal having a frequency component of f1 or f2 is mixed with a signal having a frequency twice the frequency component, i.e., 2·f1 or 2·f2, the amplitude difference ΔIM may be also introduced.

In the following, the underlying principle of the distortion canceling performed by the prior art will be described in more detail.

FIG. 6A illustrates spectra of IM distortions and an input signal having frequencies of f1 and f2 after the amplification thereof by the amplifier. In FIG. 6A, the horizontal and vertical axes represent frequency and level of signals, respectively.

FIG. 6B charts lower and higher 3rd order IM distortions, each of which has a frequency of (2·f1−f2) or (2·f2−f1) and is represented as a vector a1 or a2, respectively. In FIG. 6B, the horizontal and vertical axes represent frequency and level of signals, respectively. As shown in FIG. 6B, the lower and higher 3rd order distortion components are phase-shifted clockwise by +θ1 and +θ2 at the frequencies of (2·f1−f2) and (2·f2−f1), respectively, when the AM-PM conversion together with the AM-AM conversion is performed. Further, each of the lower and higher 3rd order distortion components is asymmetric with respect to each other (i.e., they have different level and phase) due to a frequency characteristic of the input signal.

A description on such a phase change as described above is given in Suematsu, Iyama and Ishida, "Transfer Characteristic of IM3 Relative Phase for a GaAs FET Amplifier," IEEE TRANSACTIONS ON MICROWAVE THEORY AND TECHNIQUES, VOL. 45, NO. 12, DECEMBER 1997.

Further, as shown in FIG. 6C, due to a factor other than a common factor for causing distortions, i.e., the AM-AM/AM-PM conversions or the frequency characteristic, another distortion, i.e., a vector b1, is added to the lower 3rd order distortion at the frequency of (2·f1−f2). Also, another distortion, i.e., a vector b1, is added to the higher 3rd order distortion at the frequency of (2·f2−f1).

As shown in FIG. 6C, if the two vectors a1 and b1 representing distortions at the frequency of (2·f1−f2) are summed, the lower 3rd order distortion can be represented as a vector c1=a1+b1. Likewise, the higher 3rd order distortion at the frequency of (2·f2−f1) can be represented as a vector c2=a2+b2. Here, |c1|<|c2| and each of the vectors c1 and c2 has a different phase with respect to each other, i.e., +θ3 or +θ4 clockwise, respectively, which means that there exists an unbalance between the IM distortions.

FIG. 6D describes results of distortion canceling performed on the distortions shown in FIG. 6C by using the distortion compensation circuit as shown in FIG. 4. As shown in FIG. 6D, the distortion compensation circuit of the prior art can cancel the distortion, which is represented as the vector c1, by generating a negative vector (−c1) with respect to the vector c1. However, a distortion represented as a vector d=c2−c1, which is phase-shifted by +θ5 clockwise, remains after the distortion canceling is performed on the distortion at the frequency of (2·f2−f1).

As described above, the amplifying device of the prior art, having the pre-distortion circuit for distortion canceling, has such a problem that there is an unbalance, i.e., an amplitude and/or phase difference, between the higher 3rd order distortion and the lower 3rd order distortion, wherein the unbalance cannot be canceled by the pre-distortion circuit.

SUMMARY OF THE INVENTION

It is, therefore, an object of the present invention to provide a distortion compensation circuit for reducing an unbalance between a higher 3rd order distortion and a lower 3rd order distortion generated when an input signal having more than two frequency components is amplified by an amplifier.

In accordance with a preferred embodiment of the present invention, there is provided a distortion compensation circuit for reducing an unbalance between a higher 3rd order distortion and a lower 3rd order distortion generated by an amplifier which amplifies an input signal having at least two frequency components, the distortion compensation circuit including: amplitude modulation means for performing an amplitude modulation on the input signal by using a control signal having a frequency corresponding to a difference between the frequency components wherein the distortion compensation circuit cancels the unbalance by using sideband signals generated as a result of the amplitude modulation performed by the amplitude modulation means.

Here, the amplitude modulation means may include control signal generating means for generating a control signal based on an envelope of the input signal; amplitude adjusting means for adjusting an amplitude of the control signal; phase adjusting means for adjusting a phase of the control signal; and amplitude modulation performing means for performing an amplitude modulation on the input signal based on the control signal to thereby generate the sideband signals.

Further, the distortion compensation circuit may further includes: distortion level detecting means for detecting levels of higher and lower 3rd order distortions included in the input signal after the distortion canceling being performed; and sideband signal adjusting means for adjusting the sideband signals generated by the amplitude modulation means to thereby reduce a difference between the levels.

In accordance with another preferred embodiment of the present invention, there is provided an amplifying device adopting a pre-distortion canceling method, the amplifying device including: a distortion compensation circuit in accordance with the preferred embodiment of the present invention.

Here, the amplifying device may further includes distortion level detecting means for detecting levels of higher and lower 3rd order distortions included in the input signal after the distortion canceling being performed; and sideband signal adjusting means for adjusting sideband signals generated by the amplitude modulation means to thereby reduce a difference between the levels.

In accordance with still another preferred embodiment of the present invention, there is provided a distortion compensation circuit for reducing an unbalance between a higher 3rd order distortion and a lower 3rd order distortion generated by an amplifier which amplifies an input signal having at least two frequency components, the distortion compensation circuit including: amplitude modulation means for performing an amplitude modulation on the input signal by using a control signal having a frequency corresponding to a difference between the frequency components; and phase modulation means for performing a phase modulation on the input signal by using a control signal having a frequency corresponding to a difference between the frequency components wherein the distortion compensation circuit cancels the unbalance by using sideband signals generated as a result of the amplitude and phase modulations performed by the amplitude modulation means and the phase modulation means.

Here, the amplitude modulation means may include control signal generating means for generating a control signal based on an envelope of the input signal; amplitude adjusting means for adjusting an amplitude of the control signal; phase adjusting means for adjusting a phase of the control signal; and amplitude modulation performing means for performing an amplitude modulation on the input signal based on the control signal to thereby generate the sideband signals.

Further, the phase modulation means may include control signal generating means for generating a control signal based on an envelope of the input signal; amplitude adjusting means for adjusting an amplitude of the control signal; phase adjusting means for adjusting a phase of the control signal; and phase modulation performing means for performing a phase modulation on the input signal based on the control signal to thereby generate the sideband signals.

Further, the distortion compensation circuit may further include distortion level detecting means for detecting levels of higher and lower 3rd order distortions included in the input signal after the distortion canceling being performed; and sideband signal adjusting means for adjusting the sideband signals generated by the amplitude modulation means and the phase modulation means to thereby reduce a difference between the levels.

In accordance with still another preferred embodiment of the present invention, there is provided an amplifying device adopting a pre-distortion canceling method, the amplifying device including: a distortion compensation circuit in accordance with the preferred embodiment of the present invention.

Here, the amplifying device of claim may further include distortion level detecting means for detecting levels of higher and lower 3rd order distortions included in the input signal after the distortion canceling being performed; and sideband signal adjusting means for adjusting the sideband signals generated by the amplitude modulation means and the phase modulation means to thereby reduce a difference between the levels.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

In the following, a distortion compensation circuit in accordance with the present invention will be described in detail.

The distortion compensation circuit in accordance with the present invention reduces an unbalance between a higher 3rd order distortion and a lower 3rd order distortion generated by an amplifier which amplifies an input signal having at least two frequency components, i.e., f1 and f2. To this end, the distortion compensation circuit operates as described in the following.

Figure 1:
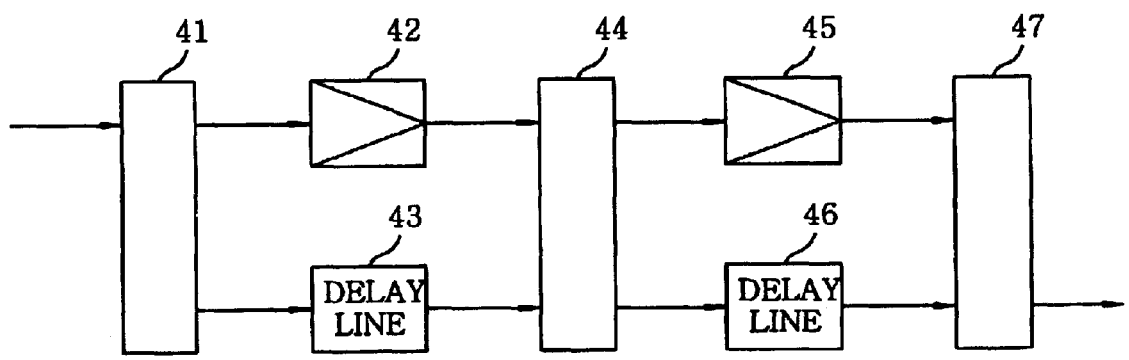
FIG. 1 depicts a conventional amplifying device including a distortion compensation circuit adopting a feed-forward method.
Figure 2:
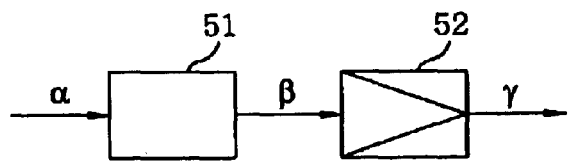
FIG. 2 charts a conventional amplifying device including a distortion compensation circuit adopting a pre-distortion method.
Figure 3A:
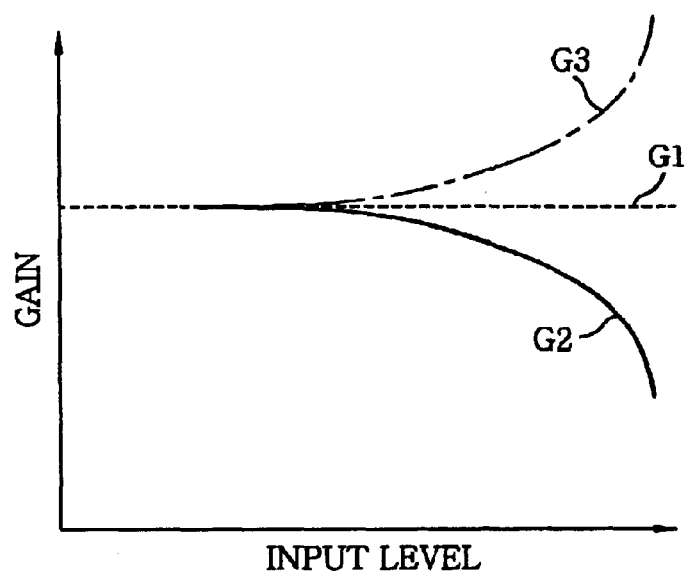
FIGS. 3A and 3B illustrate graphs to show the nonlinear characteristic of an amplifier and the operation of a pre-distortion circuit.
Figure 3B:
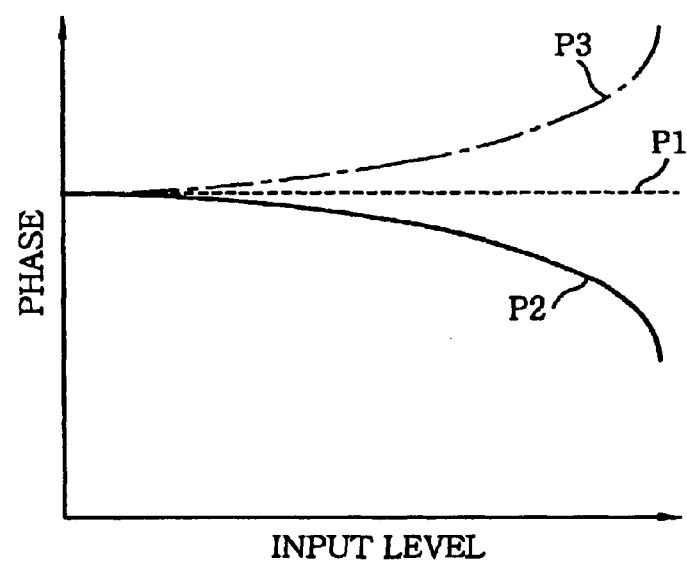
Figure 4:
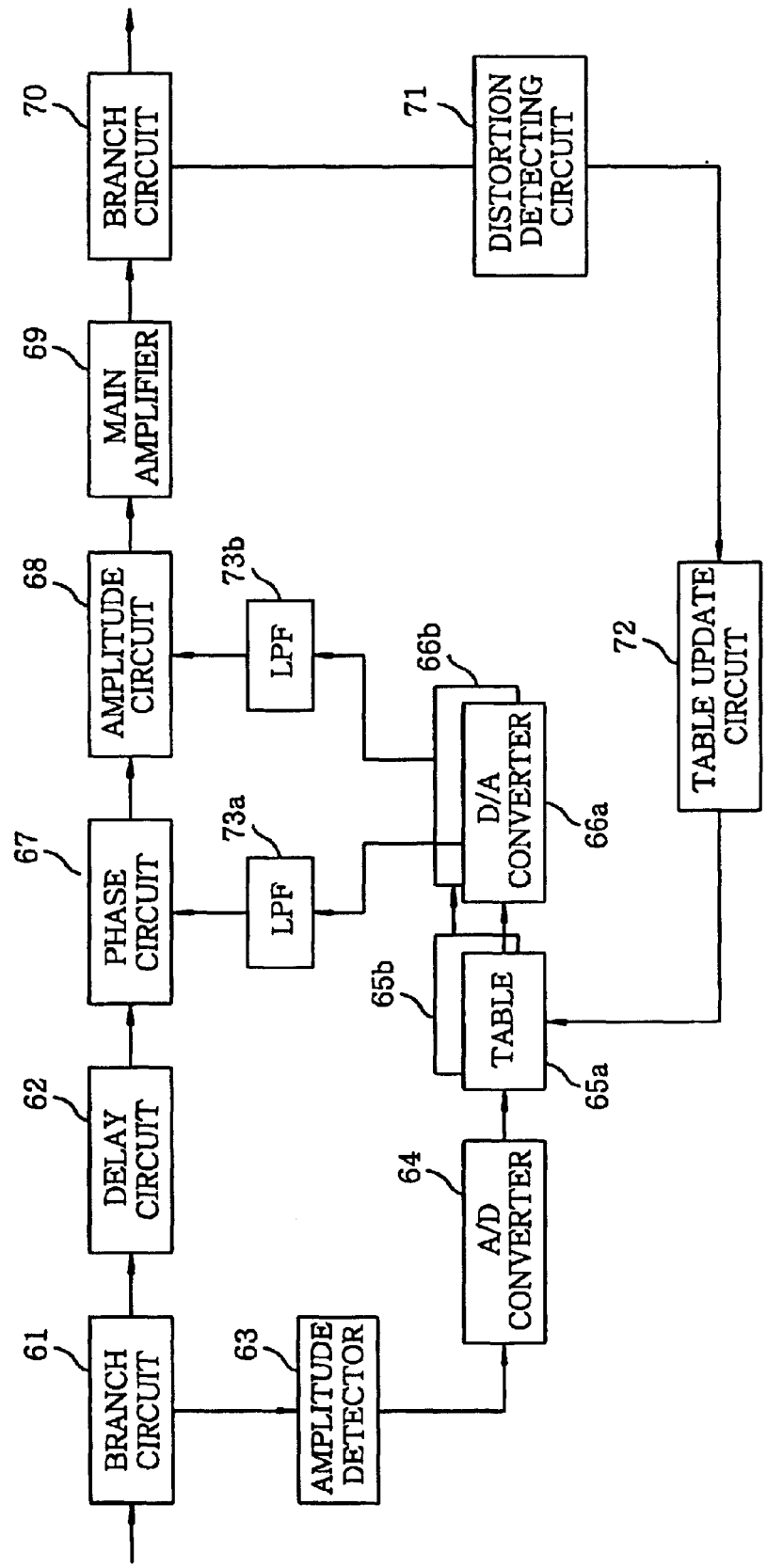
FIG. 4 exemplifies another conventional amplifying device including a distortion compensation circuit adopting a pre-distortion method.

When distortion generating means such as the phase circuit 67 and the amplitude circuit 68 as shown in FIG. 4 generates higher and lower 3rd order distortions at frequencies of (2·f2−f1) and (2·f1−f2), an amplitude modulation (AM) means and/or a phase modulation (PM) means perform amplitude and/or phase modulations on the distortions generated by the distortion generating means. In this way, phases of the distortions at the frequencies of (2·f2−f1) and (2·f1−f2) are varied, such that the unbalance between the distortions can be reduced.

In an alternative way, the amplitude modulation means and/or the phase modulation means may perform amplitude and/or phase modulations on the input signal to be inputted to the distortion generating means.

Accordingly, compared to the prior art, the present invention can further reduce the distortions of the amplifier by combining the distortions generated by the distortion generating means and sideband signals generated by the AM modulator and/or the PM modulator at the frequencies of (2·f2−f1) and (2·f1−f2).

Here, the input signal to be amplified by the amplifier can be of any type of signal, e.g., a W-CDMA signal or a multi-carrier signal.

Further, the amplifier of the present invention can be of any type of amplifier, e.g., a single amplifier or a series of amplifiers.

Meanwhile, the precision, with which the distortion canceling in accordance with the present invention is performed, is preferably set such that the distortion generated by the amplifier is completely canceled. However, on condition that the degree of the precision is practically acceptable, the distortion canceling can be performed in accordance with a variety of precisions.

Further, the amplitude and/or phase modulations in accordance with the present invention can be performed on the original input signal as well as on the input signal amplified by the amplifier. Further, when both the amplitude and the phase modulation are performed, the amplitude modulation can be performed before or after the phase modulation. Further, although the distortion generating means is preferably positioned before the amplifier, the distortion generating means may be positioned after the amplifier.

The input signal to be amplified by the amplifier may have only one frequency component f1 or f2, both of two frequency components f1 and f2, or it may have another frequency component in addition to the two frequency components.

Further, when both the amplitude and the phase modulation are performed, a sideband signal preferably is generated at one of the frequencies of (2·f2−f1) and (2·f1−f2). However, sideband signals may be generated at both the frequencies of (2·f2−f1) and (2·f1−f2).

Figure 5:
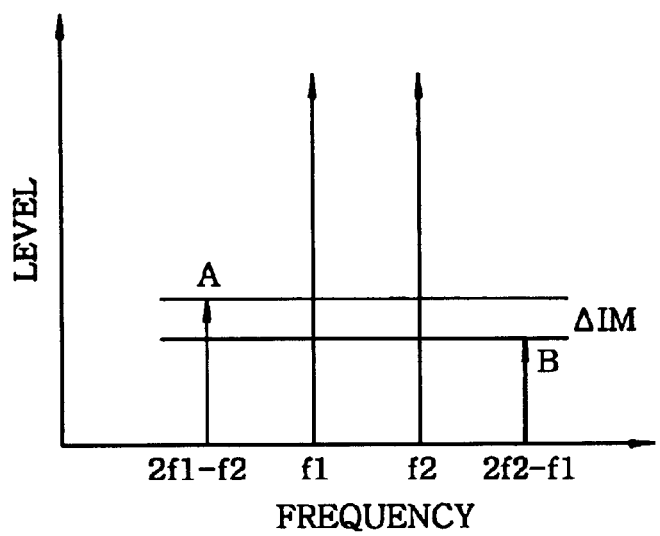
FIG. 5 illustrates an exemplary signal inputted to an amplifier and distortions generated by the amplifier.

Further, the distortions generated by the amplifier at the frequencies of (2·f2−f1) and (2·f1−f2) are those as shown in FIG. 5.

An underlying theory of the present invention now will be described in detail.

As described above referring to FIGS. 6A to 6E, the distortion compensation circuit of the prior art has a problem in that the distortion represented as the vector d remains after the distortion canceling being performed on the distortion at the frequency of (2·f2−f1).

Figure 6A:
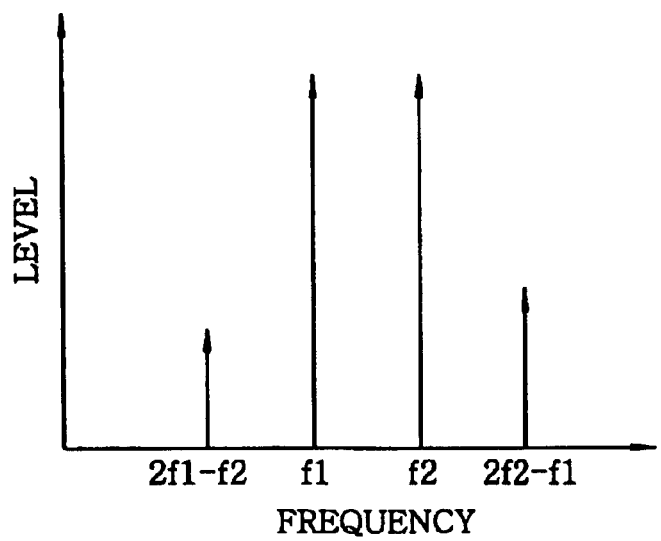
FIGS. 6A to 6F chart exemplary signal spectra to describe a method for canceling distortion components.
Figure 6B:
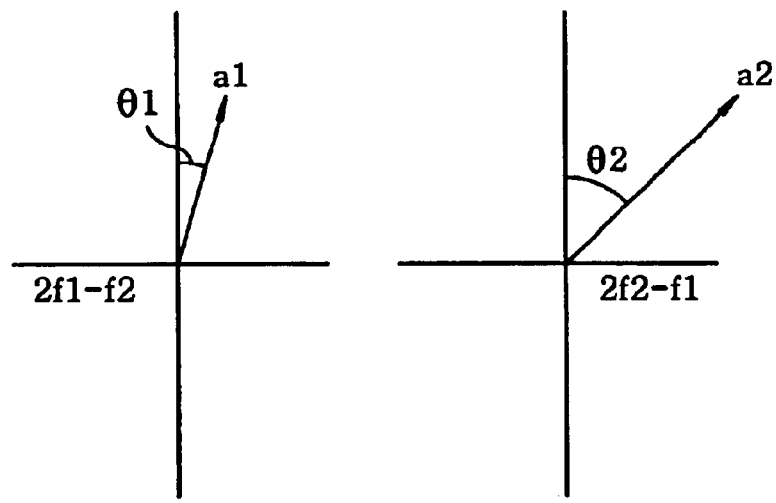
Figure 6C:
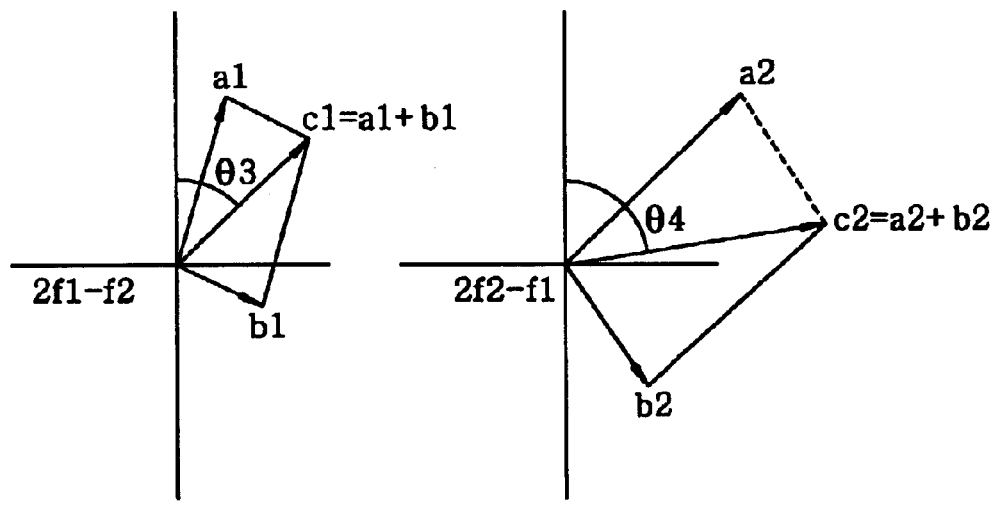
Figure 6D:
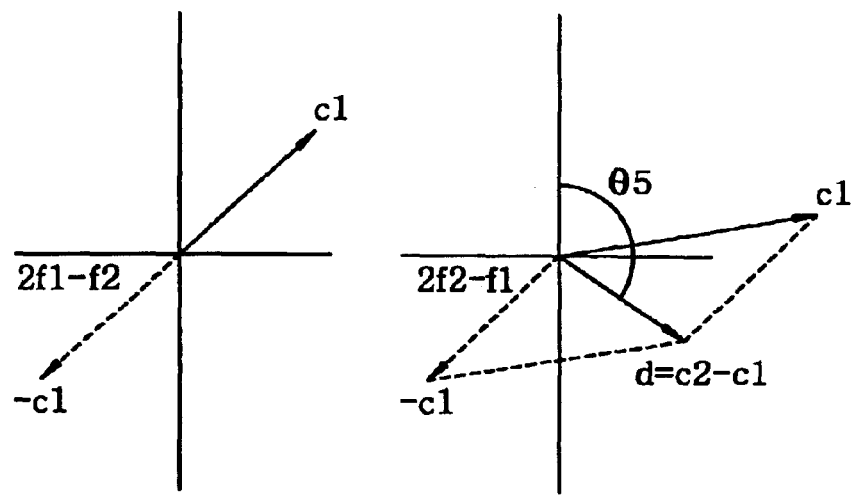
Figure 6E:
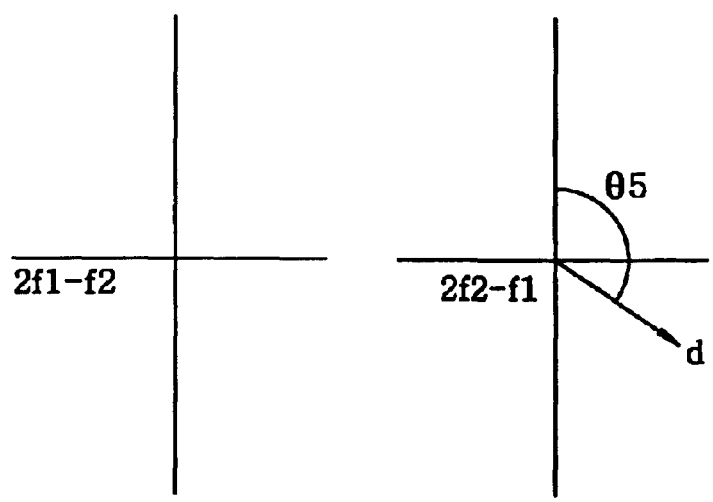
Figure 6F:
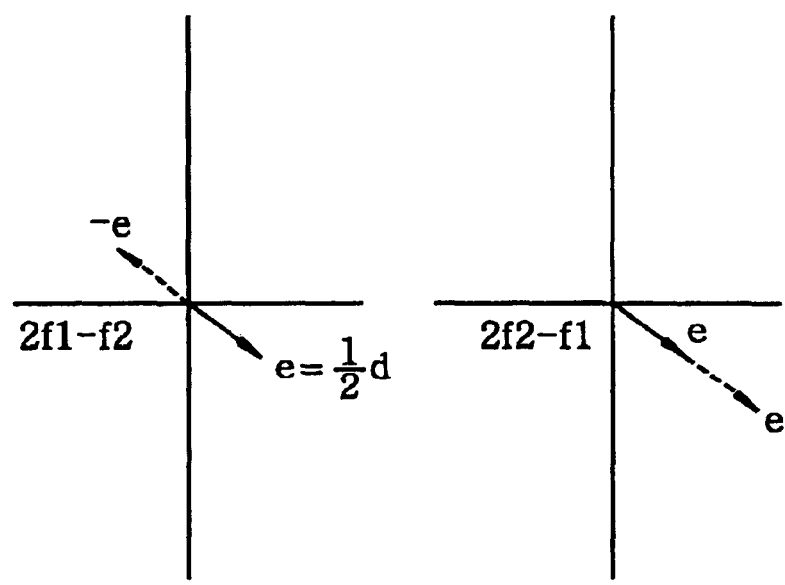

In this case, as shown in FIG. 6F, the remaining distortion component (zero vector) at the frequency of (2·f1−f2) can be divided into several terms such as {(d/2)−(d/2)}; and the vector d at the frequency of (2·f2−f1) can be divided into several terms such as {(d/2)+(d/2)}.

That is, each of the remaining distortion components at the frequencies of (2·f1−f2) and (2·f2−f1) can be divided into two components, i.e., an AM component represented as the vector e=(d/2) (represented as a solid line) or a PM component represented as the vector −e=−(d/2) (represented as a dotted line).

Such AM and/or PM components can be canceled by performing amplitude and/or phase modulations on the input signal having the frequencies of f1 and f2, to thereby generate distortions having characteristics opposite to those of the AM and/or PM components. This can be accomplished by using AM and/or PM modulators added to the distortion compensation circuit of the prior art as shown in FIG. 4.

Hereinafter, the underlying theory of the amplitude and the phase modulation will be described.

First, an exemplary method for generating an amplitude modulation component now will be explained.

Figure 7A:
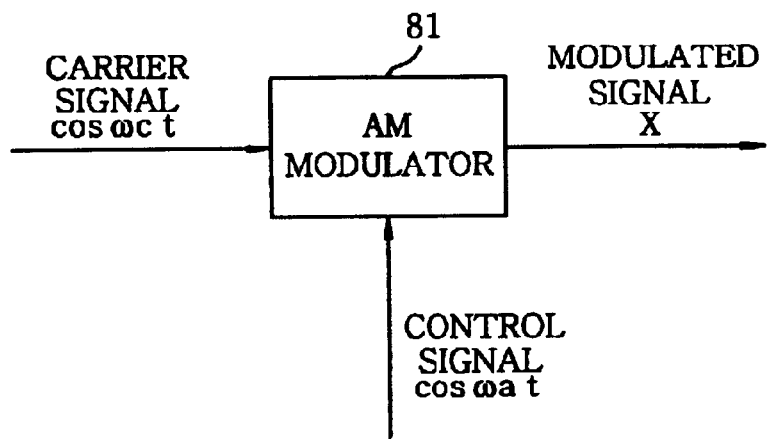
FIGS. 7A and 7B illustrate exemplary configurations of amplitude modulation.

FIG. 7A shows an exemplary configuration for performing an amplitude modulation on a carrier signal cos(ωc·t) in accordance with a control signal cos(ωa·t) and a modulation coefficient δ by using an amplitude (AM) modulator 81. In this case, the output signal x modulated by the AM modulator 81 can be expressed as Equation (6).

$$x = \{1 + \delta \cdot \cos(\omega a \cdot t)\} \cdot \cos(\omega c \cdot t) \quad \text{Equation (6)}$$
$$= \cos(\omega c \cdot t) + (\delta/2) \cdot \cos\{(\omega c + \omega a) \cdot t\} +$$
$$(\delta/2) \cdot \cos\{(\omega c - \omega a) \cdot t\}$$

Here, t, ωa and ωc represent time, an angular frequency of the AM modulation and an angular frequency of the carrier signal, respectively.

Figure 7B:
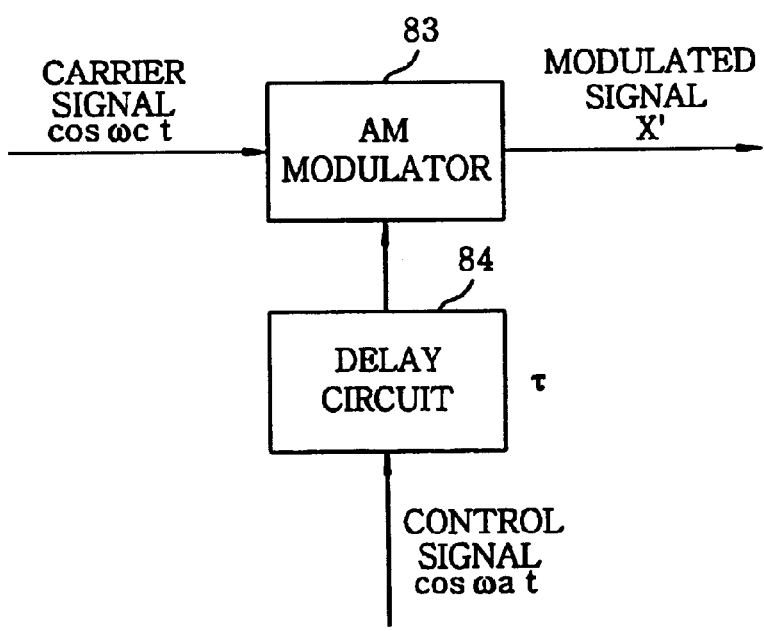

Further, FIG. 7B shows an exemplary configuration for performing an amplitude modulation on a carrier signal cos(ωc·t) in accordance with a control signal cos{ωa·(t+τ)}, which is generated by a delay circuit 84, and a modulation coefficient δ by using an amplitude (AM) modulator 83. In this case, the output signal x' modulated by the AM modulator 83 can be expressed as Equation (7).

$$x' = [1 + \delta \cdot \cos\{\omega a \cdot (t + \tau)\}] \cdot \cos(\omega c \cdot t) \quad \text{Equation (7)}$$
$$= \cos(\omega c \cdot t) + (\delta/2) \cdot \cos\{(\omega c + \omega a) \cdot t + \omega a \cdot \tau\} +$$
$$(\delta/2) \cdot \cos\{(\omega c - \omega a) \cdot t - \omega a \cdot \tau\}$$

In the results of amplitude modulations, i.e., x and x' of Equations (6) and (7), respectively, a first term having an angular frequency of ωc, a second term having an angular frequency of (ωc+ωa) and a third term having an angular frequency of (ωc−ωa) of the right side thereof correspond to a main signal, a sideband signal at a higher frequency band and a sideband signal at a lower frequency band, respectively. Here, the two sideband signals correspond to IM distortions generated by amplifying the main signal in an amplifying device.

Figure 9A:
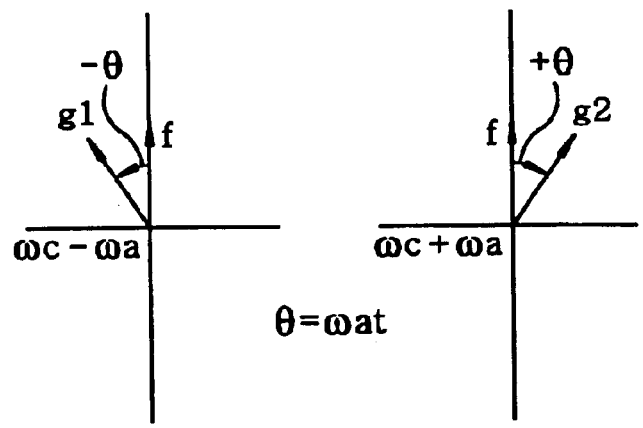
FIGS. 9A and 9B show results of amplitude and phase modulations.

FIG. 9A charts the sideband signals included in the AM results x and x' shown in Equations (6) and (7). To put it concretely, each of the sideband signals having the angular frequencies of (ωc−ωa) and (ωc+ωa), which is included in the AM result x generated when the control signal cos(ωa·t) is not delayed, is represented as a vector f. Further, the sideband signals having the angular frequencies of (ωc−ωa) and (ωc+ωa), which is included in the AM result x' generated when the control signal cos(ωa·t) is delayed, is represented as vectors g1 and g2, respectively.

As shown in FIG. 9A, the vectors g1 and g2 are phase-shifted clockwise by −θ=−(ωa·τ) and +θ=+(ωa·τ), respectively, with respect to the vector f.

In the following, an AM performed on a signal having a frequency of f1 or f2 will be described based on Equation (7).

Equations (8) and (9) show results, i.e., y1 and y2, of the AM performed on the signals, each of which has a frequency of f1 or f2, respectively. Here, the frequencies f1 and f2 correspond to angular frequencies ω1 and ω2, respectively. Further, when a modulation frequency for the AM is assumed to be (f2−f1), it becomes that ωa=(ω2−ω1).

$$y1 = \cos(\omega1 \cdot t) + (\delta/2) \cdot \cos\{(\omega1 + \omega a) \cdot t + \omega a \cdot \tau\} + \quad \text{Equation (8)}$$
$$(\delta/2) \cdot \cos\{(\omega1 - \omega a) \cdot t - \omega a \cdot \tau\}$$

$$y2 = \cos(\omega2 \cdot t) + (\delta/2) \cdot \cos\{(\omega2 + \omega a) \cdot t + \omega a \cdot \tau\} + \quad \text{Equation (9)}$$
$$(\delta/2) \cdot \cos\{(\omega2 - \omega a) \cdot t - \omega a \cdot \tau\}$$

Equation (10) describes a summation, i.e., y3, of y1 and y2.

$$y3 = y1 + y2 \quad \text{Equation (10)}$$
$$= \cos(\omega1 \cdot t) + (\delta/2) \cdot \cos(\omega2 \cdot t + \omega a \cdot \tau) +$$
$$(\delta/2) \cdot \cos\{(2 \cdot \omega1 - \omega2) \cdot t - \omega a \cdot \tau\} +$$
$$\cos(\omega2 \cdot t) + (\delta/2) \cdot \cos(\omega1 \cdot t - \omega a \cdot \tau) +$$
$$(\delta/2) \cdot \cos\{(2 \cdot \omega2 - \omega1) \cdot t + \omega a \cdot \tau\}$$

When the modulation coefficient δ is substantially small, Equation (10) can be approximated by Equation (11).

$$y3 = \cos(\omega1 \cdot t) + \cos(\omega2 \cdot t) + \quad \text{Equation (11)}$$
$$(\delta/2) \cdot \cos\{(2 \cdot \omega1 - \omega2) \cdot t - \omega a \cdot \tau\} +$$
$$(\delta/2) \cdot \cos\{(2 \cdot \omega2 - \omega1) \cdot t + \omega a \cdot \tau\}$$

In Equation (11), the angular frequencies (2·ω1−ω2) and (2·ω2−ω1) correspond to the frequencies (2·f1−f2) and (2·f2−f1), respectively. Therefore, as shown in Equation (11), the sideband signals having the frequencies of (2·f1−f2) and (2·f2−f1) can be generated by performing the AM on the signals having the frequencies of f1 and f2.

Here, the signal δ cos{(ω2−ω1)·t+ωa·τ}] corresponds to the control signal of the present invention, which has a frequency of (f2−f1). The phase adjusting means of the present invention converts the phase ωa·τ of the control signal. Further, by adjusting an amount of shifting the phase ωa·τ, phases of the two sideband signals generated by the AM means of the present invention can be controlled. Also, by adjusting the modulation coefficient δ, levels of the two sideband signals can be controlled.

Figure 10A:
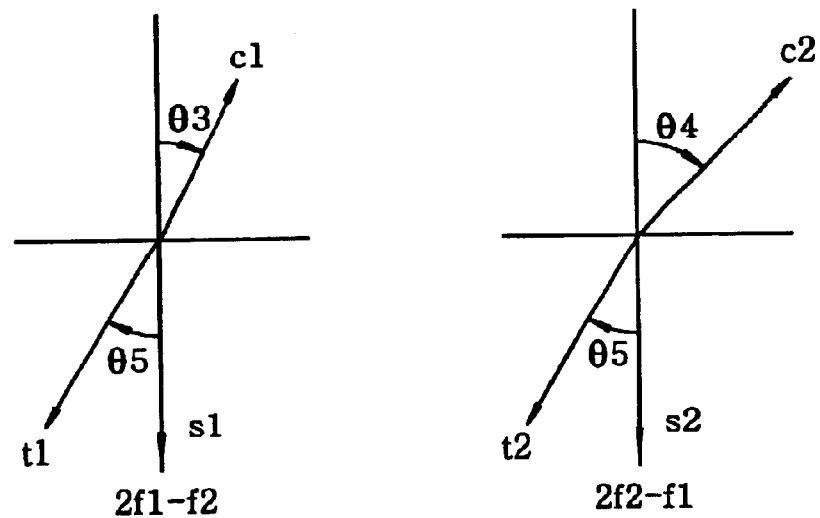
FIGS. 10A to 10C depict exemplary signal spectra showing the operation of a distortion compensation circuit in accordance with a preferred embodiment of the present invention.
Figure 10B:
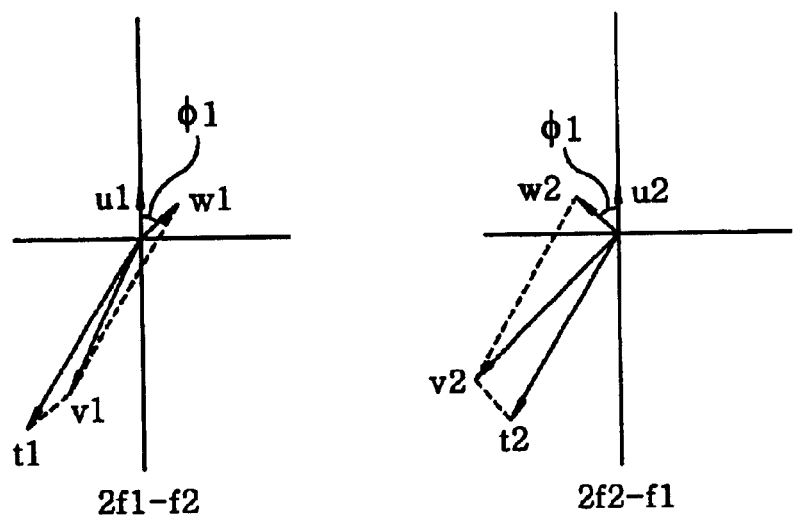
Figure 10C:
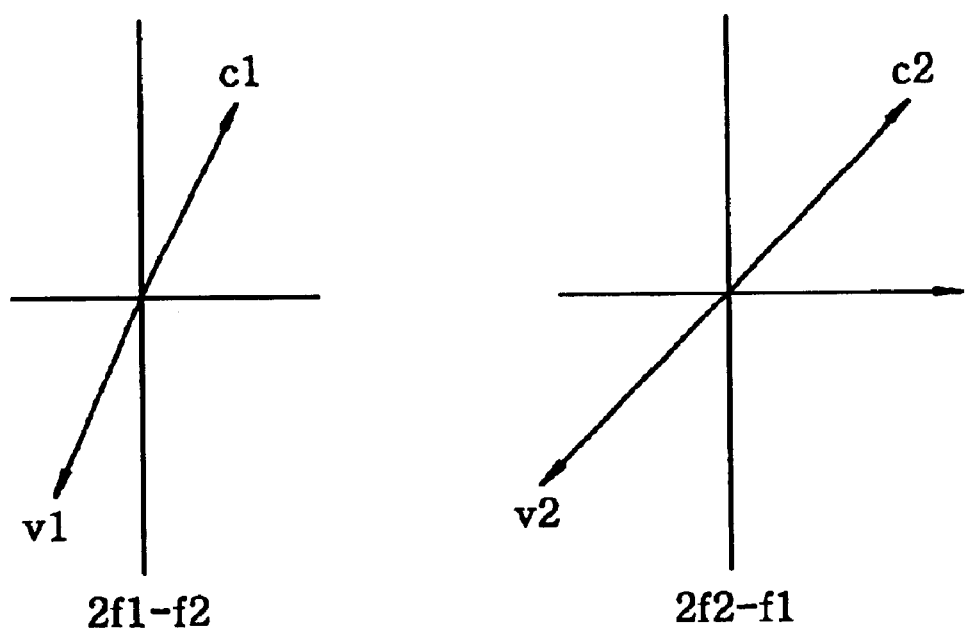

FIGS. 10A to 10C illustrate a distortion compensation procedure in accordance with the present invention based on the above-described underlying theory of the AM.

FIG. 10A depicts vectors c1 and c2, as shown in FIGS. 6C and 6D, representing lower and higher 3rd order distortions at frequencies of (2·f1−f2) and (2·f2−f1), respectively. The vectors c1 and c2 is phase-shifted clockwise by +θ3 and +θ4, respectively.

Further, FIG. 10A shows distortions generated by the amplifying device of the prior art adopting pre-distortion method as shown in FIG. 4. That is, vectors s1 and s2 represent distortions generated by the amplitude circuit 68 of the amplifying device. Also, vectors t1 and t2 represent distortions generated by the phase circuit 67 of the amplifying device. The vectors t1 and t2 are generated by performing a phase conversion on the vectors s1 and s2 by clockwise +θ5.

FIG. 10B describes results of AM performed by another amplitude circuit in accordance with the present invention. First, the amplitude circuit of the present invention generates vectors u1 and u2. The levels of the vectors u1 and u2 can be adjusted by controlling the amplitude of a control signal of the amplitude circuit. That is, the levels can be adjusted by varying a modulation coefficient of the AM. Next, a phase of the control signal is phase-shifted by Φ1 such that the vectors u1 and u2 are converted to vectors w1 and w2, respectively. FIG. 10B shows a vector v1 representing a summation of the vectors t1 and w1 and a vector v2 representing a summation of the vectors t2 and w2. The vectors v1 and v2 have opposite characteristics with respect to the vectors c1 and c2, respectively.

Accordingly, the distortions, i.e., the vectors c1 and c2, can be completely cancelled by using the amplitude circuit of the present invention together with the amplitude and phase circuits of the prior art.

Next, an exemplary method for generating a phase modulation component now will be explained.

Figure 8A:
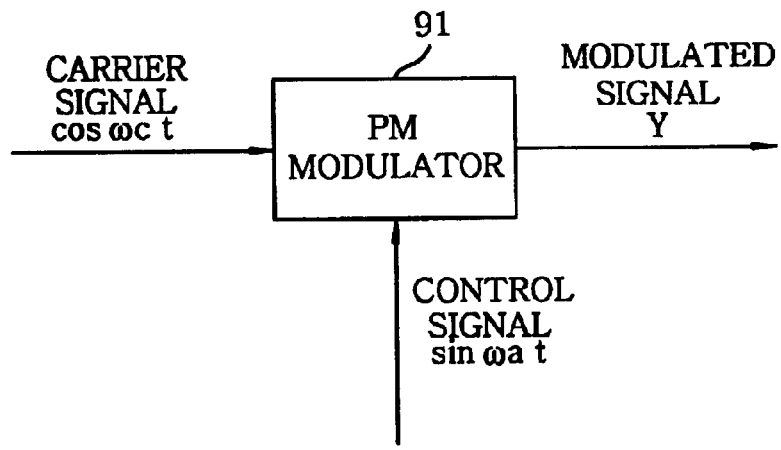
FIGS. 8A and 8B describe exemplary configurations of phase modulation.

FIG. 8A shows an exemplary configuration for performing a phase modulation on a carrier signal cos(ωc·t) in accordance with a control signal sin(ωa·t) and a modulation coefficient Φ by using a phase (PM) modulator 91. In this case, the output signal y modulated by the PM modulator 91 can be expressed like as Equation (12).

$$y = \cos\{\omega c \cdot t + \Phi \cdot \sin(\omega a \cdot t)\} \quad (12)$$

In general, Equation (12) is by using the well-known Bessel function. When the modulation coefficient $\Phi$ is substantially small, Equation (12) can be approximated by Equation (13).

$$y \approx \cos(\omega c \cdot t) - \Phi \cdot \sin(\omega a \cdot t) \cdot \sin(\omega c \cdot t) \quad \text{Equation (13)}$$
$$= \cos(\omega c \cdot t) + (\Phi/2) \cdot \cos\{(\omega c + \omega a) \cdot t\} - $$
$$(\Phi/2) \cdot \cos\{(\omega c - \omega a) \cdot t\}$$

Figure 8B:
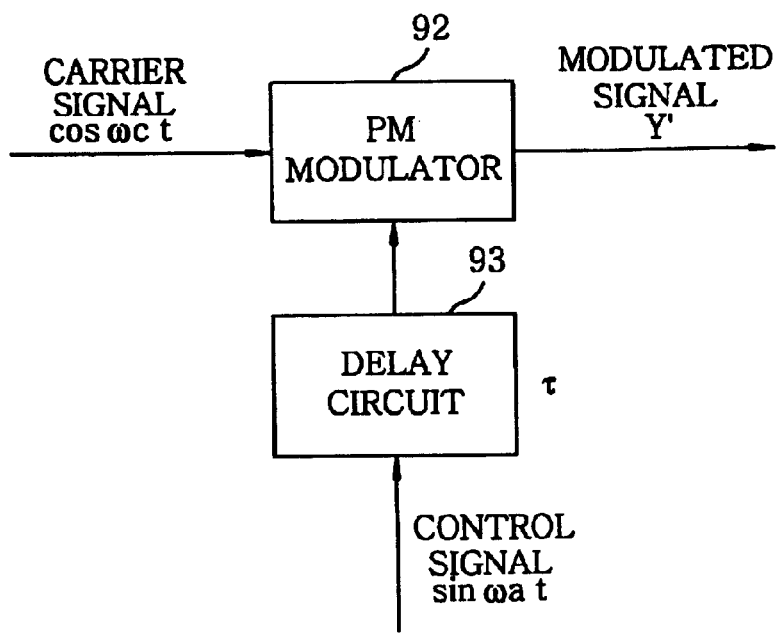

In the meanwhile, FIG. 8B shows an exemplary configuration for performing a phase modulation on a carrier signal $\cos(\omega c \cdot t)$ in accordance with a control signal $\sin\{\omega a \cdot (t+\tau)\}$, which is generated by a delay circuit 93, and a modulation coefficient $\Phi$ by using a PM modulator 92. In this case, the output signal y' modulated by the PM modulator 92 can be expressed as Equation (14), which is an approximation when the modulation coefficient $\Phi$ is substantially small.

$$y' \approx \cos(\omega c \cdot t) + (\Phi/2) \cdot \cos\{(\omega c + \omega a) \cdot t + \omega a \cdot \tau\} - \quad \text{Equation (14)}$$
$$(\Phi/2) \cdot \cos\{(\omega c - \omega a) \cdot t - \omega a \cdot \tau\}$$

In the results of phase modulations, i.e., y and y' of Equations (13) and (14), respectively, a first term having an angular frequency of $\omega c$, a second term having an angular frequency of $(\omega c+\omega a)$ and a third term having an angular frequency of $(\omega c-\omega a)$ of the right side thereof correspond to a main signal, a sideband signal at a higher frequency band and a sideband signal at a lower frequency band, respectively. Here, the two sideband signals correspond to IM distortions generated by amplifying the main signal in an amplifying device.

Figure 9B:
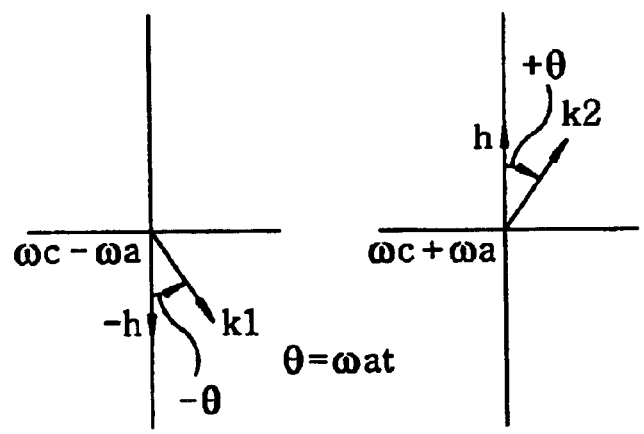

FIG. 9B charts the sideband signals included in the PM results y and y' as shown in Equations (13) and (14). To put it concretely, the sideband signals having the angular frequencies of $(\omega c-\omega a)$ and $(\omega c+\omega a)$, which is included in the PM result y generated when the control signal $\sin(\omega a \cdot t)$ is not delayed, are represented as vectors -h and h, respectively. Further, the sideband signals having the angular frequencies of $(\omega c-\omega a)$ and $(\omega c+\omega a)$, which is included in the PM result y' generated when the control signal $\sin(\omega a \cdot t)$ is delayed, is represented as vectors k1 and k2, respectively.

As shown in FIG. 9B, the vectors k1 and k2 are phase-shifted clockwise by $-\theta=-(\omega a \cdot \tau)$ and $+\theta=+(\omega a \cdot \tau)$, respectively, with respect to the vectors -h and h.

When both the AM and PM are performed on the carrier signal $\cos(\omega c \cdot t)$, a sideband signal z' can be obtained. Here, the sideband signal z' is a summation of the results x' and y' of the AM and PM, which are shown in Equations (7) and (14), respectively. The sideband signal z' can be expressed as Equation (15).

$$z' = (\delta/2) \cdot \cos\{(\omega c + \omega a) \cdot t + \omega a \cdot \tau\} + \quad \text{Equation (15)}$$
$$(\delta/2) \cdot \cos\{(\omega c - \omega a) \cdot t - \omega a \cdot \tau\} + $$
$$(\Phi/2) \cdot \cos\{(\omega c + \omega a) \cdot t + \omega a \cdot \tau\} - $$
$$(\Phi/2) \cdot \cos\{(\omega c - \omega a) \cdot t - \omega a \cdot \tau\}$$

In the following, a first example of AM and PM performed on a signal having a frequency of f1 or f2 will be described based on Equation (15).

Equations (16) and (17) show results, i.e., z'1 and z'2, of the AM and PM performed on the signals, each of which has a frequency of f1 or f2, respectively. Here, the frequencies f1 and f2 correspond to angular frequencies $\omega 1$ and $\omega 2$, respectively. Further, when a modulation frequency for the AM and PM is assumed to be (f2-f1), it becomes that $\omega a=(\omega 2-\omega 1)$.

$$z'1 = (\delta/2) \cdot \cos\{\omega 2 \cdot t + (\omega 2 - \omega 1) \cdot \tau\} + \quad \text{Equation (16)}$$
$$(\delta/2) \cdot \cos\{(2 \cdot \omega 1 - \omega 2) \cdot t - (\omega 2 - \omega 1) \cdot \tau\} + $$
$$(\Phi/2) \cdot \cos\{\omega 2 \cdot t + (\omega 2 - \omega 1) \cdot \tau\} - $$
$$(\Phi/2) \cdot \cos\{(2 \cdot \omega 1 - \omega 2) \cdot t - (\omega 2 - \omega 1) \cdot \tau\}$$

$$z'2 = (\delta/2) \cdot \cos\{\omega 1 \cdot t - (\omega 2 - \omega 1) \cdot \tau\} + \quad \text{Equation (17)}$$
$$(\delta/2) \cdot \cos\{(2 \cdot \omega 2 - \omega 1) \cdot t + (\omega 2 - \omega 1) \cdot \tau\} - $$
$$(\Phi/2) \cdot \cos\{\omega 1 \cdot t - (\omega 2 - \omega 1) \cdot \tau\} + $$
$$(\Phi/2) \cdot \cos\{(2 \cdot \omega 2 - \omega 1) \cdot t + (\omega 2 - \omega 1) \cdot \tau\}$$

When the modulation coefficients $\delta$ and $\Phi$ are identical, i.e., $\eta=\delta=\Phi$, Equations (16) and (17) become Equations (18) and (19), respectively.

$$z'1 = \eta \cdot \cos\{\omega 2 \cdot t + (\omega 2 - \omega 1) \cdot \tau\} \quad (18)$$

$$z'2 = \eta \cdot \cos\{(2 \cdot \omega 2 - \omega 1) \cdot t - (\omega 2 - \omega 1) \cdot \tau\} \quad (19)$$

In Equations (18) and (19), an angular frequency $(2 \cdot \omega 2-\omega 1)$ corresponds to the frequency $(2 \cdot f2-f1)$. Therefore, as shown in Equations (18) and (19), only a sideband signal having the frequency of $(2 \cdot f2-f1)$ is generated by performing the AM and PM on the signals having the frequencies of f1 and f2. Here, by adjusting the modulation coefficient $\eta=\delta=\Phi$, a level of the sideband signal can be controlled. Further, by adjusting the delay time $\tau$ of the control signal, a phase of the sideband signal can be controlled. Further, in Equation (19), a signal having the frequency f1 corresponding to the angular frequency $\omega 1$ can be ignored because an amplitude thereof is substantially small when compared to that of a main signal.

FIGS. 11A to 11D show a distortion compensation procedure of the present invention based on the above-described underlying theory of the AM and PM.

Figure 11A:
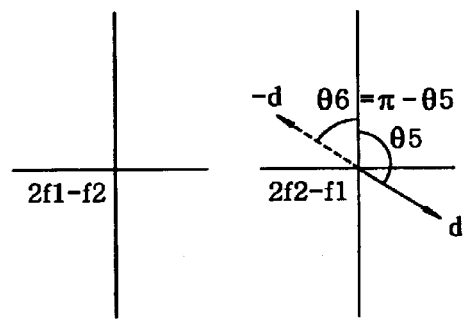
FIGS. 11A to 11D chart exemplary signal spectra showing the operation of a distortion compensation circuit in accordance with another preferred embodiment of the present invention.

FIG. 11A depicts a vector d as a solid line, as shown in FIGS. 6E and 6F, representing a remaining distortion at the frequency of $(2 \cdot f2-f1)$ after the distortion canceling performed in accordance with the prior art. Also, FIG. 11A charts a vector -d as a dotted line to cancel the vector d. The vectors d and -d are phase-shifted clockwise by $+\theta 5$ and $-\theta 6=-(\pi-\theta 5)$, respectively.

In the meanwhile, a sideband signal z'a(f1, f2), which is included in a result of an AM performed on a signal having frequencies of f1 and f2, can be expressed as Equation (20). That is, the sideband signal z'a(f1, f2) can be expressed as a summation of sideband signals z'a(f1) and z'a(f2), as shown in Equation (7), which are included in the result of the AM when $\omega c=\omega 1$ and $\omega c=\omega 2$, respectively.

$$z'a(f1, f2) = z'a(f1) + z'a(f2) \quad \text{Equation (20)}$$
$$= (\delta/2) \cdot \cos\{\omega 2 \cdot t + (\omega 2 - \omega 1) \cdot \tau\} + $$
$$(\delta/2) \cdot \cos\{(2 \cdot \omega 1 - \omega 2) \cdot t - (\omega 2 - \omega 1) \cdot $$
$$\tau\} + (\delta/2) \cdot \cos\{\omega 1 \cdot t - (\omega 2 - \omega 1) \cdot \tau\} + $$
$$(\delta/2) \cdot \cos\{(2 \cdot \omega 2 - \omega 1) \cdot t + $$
$$(\omega 2 - \omega 1) \cdot \tau\}$$

Particularly, a signal z'ad(f1, f2) having frequencies of $(2 \cdot f1-f2)$ and $(2 \cdot f2-f1)$ can be extracted from the sideband signal z'a(f1, f2), which is represented as Equation (21)

$$z'ad(f1, f2) = (\delta/2) \cdot \cos\{(2 \cdot \omega 1 - \omega 2) \cdot t - \qquad \text{Equation (21)}$$
$$(\omega 2 - \omega 1) \cdot \tau\} + (\delta/2) \cdot$$
$$\cos\{(2 \cdot \omega 2 - \omega 1) \cdot t + (\omega 2 - \omega 1) \cdot \tau\}$$

Figure 11B:
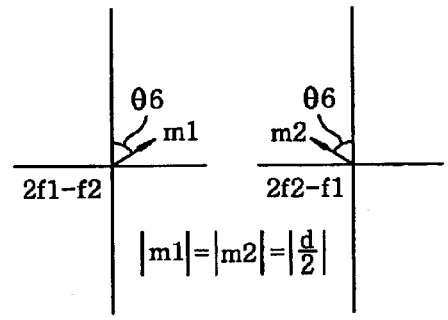

FIG. 11B illustrates exemplary sideband signals generated by performing an AM as shown in Equation (21). In Equation (21), a first term and a second term of the right side thereof correspond to vectors m1 and m2 at the frequencies of (2·f1−f2) and (2·f2−f1), respectively. Here, the AM coefficient δ is adjusted such that δ=|d|. In this case, it becomes that |m1|=|m2|=|d/2|. Further, the delay time τ imposed on the control signal cos(ωa·t) is controlled such that (ω2−ω1)·τ=−θ6.

In the meanwhile, a sideband signal z'p(f1, f2), which is included in a result of a PM performed on a signal having frequencies of f1 and f2, can be expressed as Equation (22). That is, the sideband signal z'p(f1, f2) can be expressed as a summation of sideband signals z'p(f1) and z'p(f2), as shown in Equation (14), which are included in the result of the PM modulation when ωc=ω1 and ωc=ω2, respectively.

$$z'p(f1, f2) = z'p(f1) + z'p(f2) \qquad \text{Equation (22)}$$
$$= (\Phi/2) \cdot \cos\{\omega 2 \cdot t + (\omega 2 - \omega 1) \cdot \tau\} -$$
$$(\Phi/2) \cdot \cos\{(2 \cdot \omega 1 - \omega 2) \cdot t - (\omega 2 - \omega 1) \cdot$$
$$\tau\} - (\Phi/2) \cdot \cos\{\omega 1 \cdot t - (\omega 2 - \omega 1) \cdot \tau\} +$$
$$(\Phi/2) \cdot \cos\{(2 \cdot \omega 2 - \omega 1) \cdot t +$$
$$(\omega 2 - \omega 1) \cdot \tau\}$$

Particulary, a signal z'pd(f1, f2) having frequencies of (2·f1−f2) and (2·f2−f1) can be extracted from the sideband signal z'p(f1, f2), which is represented as Equation (23).

$$z'pd(f1, f2) = -(\Phi/2) \cdot \cos\{(2 \cdot \omega 1 - \omega 2) \cdot t - \qquad \text{Equation (23)}$$
$$(\omega 2 - \omega 1) \cdot \tau\} + (\Phi/2) \cdot$$
$$\cos\{(2 \cdot \omega 2 - \omega 1) \cdot t + (\omega 2 - \omega 1) \cdot \tau\}$$

Figure 11C:
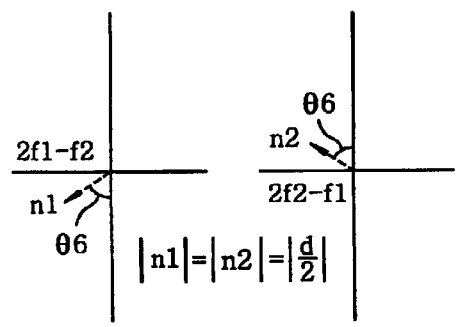

FIG. 11C illustrates exemplary sideband signals generated by performing a PM as shown in Equation (23). In Equation (23), a first term and a second term of the right side thereof correspond to vectors n1 and n2 at the frequencies of (2·f1−f2) and (2·f2−f1), respectively. Here, the PM coefficient Φ is adjusted such that Φ=|d|. In this case, it becomes that |n1|=|n2|=|d/2|. Further, the delay time τ imposed on the control signal sin(ωa·t) is controlled such that (ω2−ω1)·τ=−θ6.

A summation z'apd(f1, f2) of the distortions generated by performing the AM and PM as shown in Equations (21) and (23) can be expressed as Equation (24).

$$z'apd(f1, f2) = (\delta/2) \cdot \cos\{(2 \cdot \omega 1 - \omega 2) \cdot t - \qquad \text{Equation (24)}$$
$$(\omega 2 - \omega 1) \cdot \tau\} + (\delta/2) \cdot$$
$$\cos\{(2 \cdot \omega 2 - \omega 1) \cdot t + (\omega 2 - \omega 1) \cdot$$
$$\tau\} - (\Phi/2) \cdot \cos\{(2 \cdot \omega 1 - \omega 2) \cdot t -$$
$$(\omega 2 - \omega 1) \cdot \tau\} + (\Phi/2) \cdot \cos\{(2 \cdot$$
$$\omega 2 - \omega 1) \cdot t + (\omega 2 - \omega 1) \cdot t\}$$
$$= d | \cdot \cos\{(2 \cdot \omega 2 - \omega 1) \cdot t +$$
$$(\omega 2 - \omega 1) \cdot \tau\}$$

Figure 11D:
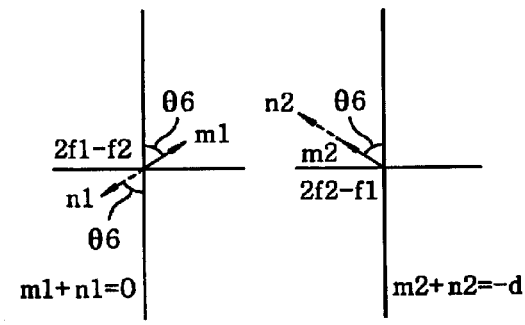

FIG. 11D charts a summation of the sideband signals shown in FIGS. 11B and 11C, which corresponds to the summation z'apd(f1, f2) as shown in Equation (24). That is, a zero vector remains at the frequency of (2·f1−f2) after the vectors m1 and n1, each of which has an identical length and a reverse phase with respect to each other, are summed. Also, a vector −d remains at the frequency of (2·f2−f1) after the vectors m2 and n2, each of which has identical length and phase with respect to each other, are summed.

Here, the control signals δ cos{(ω2−ω1)·(t+τ)} and Φ·sin{(ω2−ω1)·(t+τ)} used in the AM and PM, respectively, correspond to the control signals having a frequency of (f2−f1) in accordance with the present invention.

In the following, a second example of AM and PM performed on a signal having a frequency of f1 or f2 will be described.

In this example, the delay time of the control signal sin(ωa·t) for the PM is set to be (τ+π/ωa) such that the PM result y' as shown in Equation (14) has a reverse phase with respect to the AM result x' as shown in Equation (7). And then, sideband signals included in the signal x' and phase-shifted signal y' are summed to generate a result z″ as expressed in Equation (25).

$$z'' = (\delta/2) \cdot \cos\{(\omega c + \omega a) \cdot t + \omega a \cdot \tau\} + \qquad \text{Equation (25)}$$
$$(\delta/2) \cdot \cos\{(\omega c - \omega a) \cdot t - \omega a \cdot \tau\} +$$
$$(\Phi/2) \cdot \cos\{(\omega c + \omega a) \cdot t + \omega a \cdot \tau + \pi\} -$$
$$(\Phi/2) \cdot \cos\{(\omega c - \omega a) \cdot t - \omega a \cdot \tau - \pi\}$$
$$= (\delta/2) \cdot \cos\{(\omega c + \omega a) \cdot t + \omega a \cdot \tau\} +$$
$$(\delta/2) \cdot \cos\{(\omega c - \omega a) \cdot t - \omega a \cdot \tau\} -$$
$$(\Phi/2) \cdot \cos\{(\omega c + \omega a) \cdot t + \omega a \cdot \tau\} +$$
$$(\Phi/2) \cdot \cos\{(\omega c - \omega a) \cdot t - \omega a \cdot \tau\}$$

In the following, an example of AM and PM performed on a signal having a frequency of f1 or f2 will be described based on Equation (25).

Equations (26) and (27) show results, i.e., z″1 and z″2, of the AM and PM performed on the signals, each of which has a frequency of f1 or f2, respectively. Here, the frequencies f1 and f2 correspond to angular frequencies ω1 and ω2, respectively. Further, when a modulation frequency for the AM and PM is assumed to be (f2−f1), it becomes that ωa=(ω2−ω1).

$$z''1 = (\delta/2) \cdot \cos\{\omega 2 \cdot t + (\omega 2 - \omega 1) \cdot \tau\} + \qquad \text{Equation (26)}$$
$$(\delta/2) \cdot \cos\{(2 \cdot \omega 1 - \omega 2) \cdot t - (\omega 2 - \omega 1) \cdot \tau\} -$$
$$(\Phi/2) \cdot \cos\{\omega 2 \cdot t + (\omega 2 - \omega 1) \cdot \tau\} +$$
$$(\Phi/2) \cdot \cos\{(2 \cdot \omega 1 - \omega 2) \cdot t - (\omega 2 - \omega 1) \cdot \tau\}$$

$$z''2 = (\delta/2) \cdot \cos\{\omega 1 \cdot t - (\omega 2 - \omega 1) \cdot \tau\} + \qquad \text{Equation (27)}$$
$$(\delta/2) \cdot \cos\{(2 \cdot \omega 2 - \omega 1) \cdot t + (\omega 2 - \omega 1) \cdot \tau\} +$$
$$(\Phi/2) \cdot \cos\{\omega 1 \cdot t - (\omega 2 - \omega 1) \cdot \tau\} -$$
$$(\Phi/2) \cdot \cos\{(2 \cdot \omega 2 - \omega 1) \cdot t + (\omega 2 - \omega 1) \cdot \tau\}$$

When the modulation coefficients δ and Φ are identical, i.e., η=δ=Φ, Equations (26) and (27) become Equations (28) and (29), respectively.

$$z''1 = \eta \cdot \cos\{(2\cdot\omega1-\omega2)\cdot t - (\omega2-\omega1)\cdot\tau\} \quad (28)$$

$$z''2 = \eta \cdot \cos\{\omega1\cdot t - (\omega2-\omega1)\cdot\tau\} \quad (29)$$

In Equations (28) and (29), an angular frequency $(2\cdot\omega2-\omega1)$ corresponds to the frequency $(2\cdot f2-f1)$. Therefore, as shown in Equations (28) and (29), only a sideband signal having the frequency of $(2\cdot f2-f1)$ is generated by performing the AM and PM on the signals having the frequencies of f1 and f2. Here, by adjusting the modulation coefficient $\eta=\delta=\Phi$, a level of the sideband signal can be controlled. Further, by adjusting the delay time $\tau$ or $(\tau+\pi/\omega a)$ of the control signal, a phase of the sideband signal can be controlled. Further, in Equation (29), a signal having the frequency f1 corresponding to the angular frequency $\omega1$ can be ignored because an amplitude thereof is substantially small when compared to that of a main signal.

Hereinafter, a distortion compensation procedure of the present invention based on the above-described underlying theory of the AM and PM will be described with reference to FIGS. 11A to 11D.

In the following, the vectors illustrated in FIGS. 11A to 11D are assumed to be positioned at different frequencies. That is, the vectors at the frequency of $(2\cdot f1-f2)$ are assumed to be positioned at the frequency of $(2\cdot f2-f1)$ and vice versa.

In this example, vectors d', −d', m'1, m'2, n'1 and n'2 correspond to the vectors d, −d, m1, m2, n1 and n2, respectively, as shown in FIGS. 11A to 11D. Further, phases θ'5 and θ'6 correspond to the phases θ5 and θ6, respectively.

In the second example, a vector d' represents a remaining distortion at the frequency of $(2\cdot f1-f2)$ after the distortion canceling performed in accordance with the prior art. Also, a sideband signal, i.e., a vector −d', should be generated at the frequency of $(2\cdot f1-f2)$ to cancel the vector d'. The vectors d' and −d' are phase-shifted clockwise by +θ'5 and θ'6=−(π−θ'5), respectively.

In the meanwhile, a sideband signal z''a(f1, f2), which is included in a result of an AM performed on a signal having frequencies of f1 and f2, can be expressed as Equation (30). That is, the sideband signal z''a(f1, f2) can be expressed as a summation of sideband signals z''a(f1) and z''a(f2), as shown in Equation (7), which are included in the result of the AM when $\omega c=\omega 1$ and $\omega c=\omega 2$, respectively.

$$z''a(f1, f2) = z''a(f1) + z''a(f2) \quad \text{Equation (30)}$$

$$= (\delta/2)\cdot\cos\{\omega 2 \cdot t + (\omega 2 - \omega 1)\cdot\tau\} +$$

$$(\delta/2)\cdot\cos\{(2\cdot\omega 1 - \omega 2)\cdot t -$$

$$(\omega 2 - \omega 1)\cdot\tau\} + (\delta/2)\cdot\cos\{\omega 1 \cdot t -$$

$$(\omega 2 - \omega 1)\cdot\tau\} + (\delta/2)\cdot\cos\{(2\cdot$$

$$\omega 2 - \omega 1)\cdot t + (\omega 2 - \omega 1)\cdot\tau\}$$

Particularly, a signal z''ad(f1, f2) having frequencies of $(2\cdot f1-f2)$ and $(2\cdot f2-f1)$ can be extracted from the sideband signal z''a(f1, f2), which is represented as Equation (31)

$$z''ad(f1, f2) = (\delta/2)\cdot\cos\{(2\cdot\omega 1 - \omega 2)\cdot t - \quad \text{Equation (31)}$$

$$(\omega 2 - \omega 1)\cdot\tau\} + (\delta/2)\cdot\{(2\cdot$$

$$\omega 2 - \omega 1)\cdot t + (\omega 2 - \omega 1)\cdot\tau\}$$

In Equation (31), a first term and a second term of the right side thereof correspond to vectors m'1 and m'2 at the frequencies of $(2\cdot f1-f2)$ and $(2\cdot f2-f1)$, respectively. Here, the AM coefficient δ is adjusted such that δ=|d'|. In this case, it becomes that |m'1|=|m'2|=|d'/2|. Further, the delay time $\tau$ imposed on the control signal $\cos(\omega a \cdot t)$ is controlled such that $(\omega 2 - \omega 1)\cdot\tau = -\theta'6$.

In the meanwhile, a sideband signal z''p(f1, f2), which is included in a result of a PM performed on a signal having frequencies of f1 and f2, can be expressed as Equation (32). That is, the sideband signal z''p(f1, f2) can be expressed as a summation of sideband signals z''p(f1) and z''p(f2), as shown in Equation (14), which are included in the result of the PM when $\omega c=\omega 1$ and $\omega c=\omega 2$, respectively.

$$z''p(f1, f2) = z''p(f1) + z''p(f2) \quad \text{Equation (32)}$$

$$= -(\Phi/2)\cdot\cos\{\omega 2 \cdot t + (\omega 2 - \omega 1)\cdot\tau\} +$$

$$(\Phi/2)\cdot\cos\{(2\cdot\omega 1 - \omega 2)\cdot t -$$

$$(\omega 2 - \omega 1)\cdot\tau\} + (\Phi/2)\cdot\cos\{\omega 1 \cdot t -$$

$$(\omega 2 - \omega 1)\cdot\tau\} - (\Phi/2)\cdot\cos\{(2\cdot$$

$$\omega 2 - \omega 1)\cdot t + (\omega 2 - \omega 1)\cdot\tau\}$$

Particularly, a signal z''pd(f1, f2) having frequencies of $(2\cdot f1-f2)$ and $(2\cdot f2-f1)$ can be extracted from the sideband signal z''p(f1, f2), which is represented as Equation (33).

$$z''pd(f1, f2) = (\Phi/2)\cdot\cos\{(2\cdot\omega 1 - \omega 2)\cdot \quad \text{Equation (33)}$$

$$t - (\omega 2 - \omega 1)\cdot\tau\} - (\Phi/2)\cdot\cos$$

$$\{(2\cdot\omega 2 - \omega 1)\cdot t + (\omega 2 - \omega 1)\cdot\tau\}$$

In Equation (33), a first term and a second term of the right side thereof correspond to vectors n'1 and n'2 at the frequencies of $(2\cdot f1-f2)$ and $(2\cdot f2-f1)$, respectively. Here, the PM coefficient $\Phi$ is adjusted such that $\Phi=|d'|$. In this case, it becomes that |n'1|=|n'2|=|d'/2|. Further, the delay time $(\tau+\pi/\omega a)$ imposed on the control signal $\sin(\omega a \cdot t)$ is controlled such that $(\omega 2 - \omega 1)\cdot\tau = -\theta'6$.

A summation z''apd(f1, f2) of the distortions generated by performing the AM and PM as shown in Equations (31) and (33) can be expressed as Equation (34).

$$z''apd(f1, f2) = (\delta/2)\cdot\cos\{(2\cdot\omega 1 - \omega 2)\cdot t - \quad \text{Equation (34)}$$

$$(\omega 2 - \omega 1)\cdot\tau\} + (\delta/2)\cdot\cos$$

$$\{(2\cdot\omega 2 - \omega 1)\cdot t + (\omega 2 - \omega 1)\cdot\tau\} +$$

$$(\Phi/2)\cdot\cos\{(2\cdot\omega 1 - \omega 2)\cdot t -$$

$$(\omega 2 - \omega 1)\cdot\tau\} - (\Phi/2)\cdot\cos$$

$$\{(2\cdot\omega 2 - \omega 1)\cdot t + (\omega 2 - \omega 1)\cdot\tau\}$$

$$= |d'|\cdot\cos\{(2\cdot\omega 2 - \omega 1)\cdot t -$$

$$(\omega 2 - \omega 1)\cdot\tau\}$$

As described above, a zero vector remains at the frequency of $(2\cdot f2-f1)$ after the vectors m'2 and n'2, each of which has an identical length and a reverse phase with respect to each other, are summed. Also, a vector −d' remains at the frequency of $(2\cdot f1-f2)$ after the vectors m'1 and n'1, each of which has identical length and phase with respect to each other, are summed.

Here, the control signals $\delta \cos\{(\omega 2-\omega 1)\cdot(t+\tau)\}$ and $\Phi\cdot\sin[(\omega 2-\omega 1)\cdot\{t+\tau+\pi/(\omega 2-\omega 1)\}] = (-\Phi)\cdot\sin\{(\omega 2-\omega 1)\cdot(t+\tau)\}$ used in the AM and PM, respectively, correspond to the control signal having a frequency of (f2−f1) in accordance with the present invention.

In the following, amplifying devices in accordance with preferred embodiments of the present invention will be described with reference to the drawings.

Figure 12:
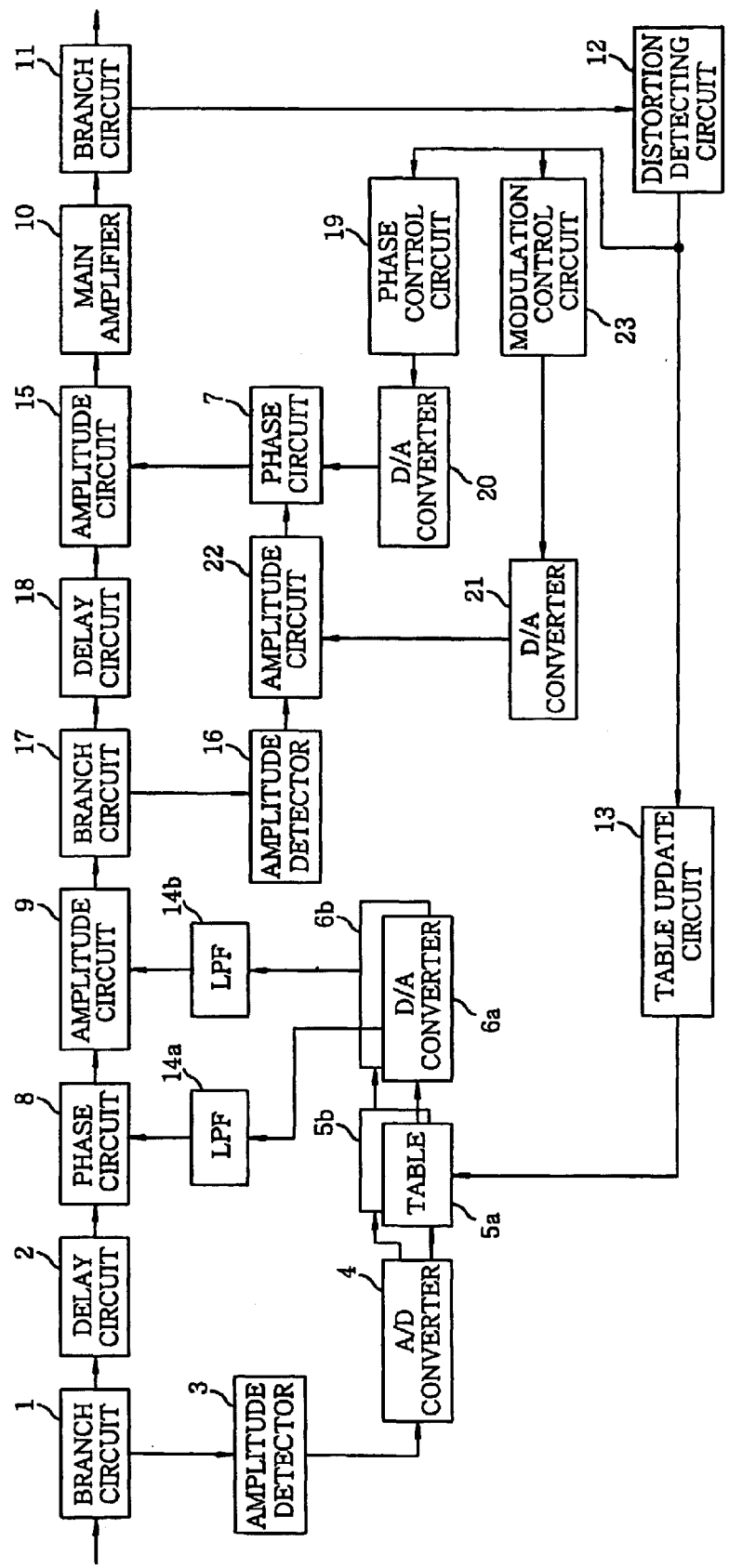
FIG. 12 illustrates an exemplary configuration of an amplifying device including a distortion compensation circuit in accordance with a first preferred embodiment of the present invention.

FIG. 12 illustrates an exemplary configuration of an amplifying device including a distortion compensation circuit adopting a pre-distortion canceling method in accordance with a first preferred embodiment of the present invention.

The amplifying device of FIG. 12 includes a branch circuit 1, a delay circuit 2 (e.g., delay line), an amplitude detector 3, an A/D converter 4, tables 5a and 5b for the correction of a phase and an amplitude, two D/A converters 6a and 6b, two LPF's 14a and 14b, a phase circuit 8 for controlling a phase of a main signal, an amplitude circuit 9 for controlling an amplitude of the main signal, another branch circuit 17, another amplitude detector 16, another amplitude circuit 22, another phase circuit 7, another delay circuit 18 for delaying the main signal, still another amplitude circuit 15, a main amplifier 10, still another branch circuit 11, a distortion detection circuit 12, a table update circuit 13, a phase control circuit 19 for adjusting a phase of a control signal for the amplitude circuit 15, a modulation control circuit 23 for adjusting an amplitude of the control signal for the amplitude circuit 15, another two D/A converters 20 and 21 for converting an output of the phase control circuit 19 and the modulation control circuit 23, respectively, into an analog signal. Here, the amplitude detectors 3 and 16 can use a square-law detection method or any other method on the condition that it detects an envelope component of a signal. Further, in order to remove a high-frequency component of an output of the amplitude detectors 3 and 16, an LPF may be added to the output thereof.

The branch circuit 1 outputs an RF signal having frequencies of f1 and f2 to the phase circuit 8 as an input signal thereof through the delay circuit 2. At the same time, a part of the RF signal from the branch circuit 1 is outputted to the amplitude detector 3.

The amplitude detector 3 performs amplitude detection on the RF signal from the branch circuit 1, to thereby output the detected amplitude to the A/D converter 4.

The A/D converter 4 converts the detected amplitude into a digital signal. The digital signal is inputted to the table 5a for phase correction and the table 5b for amplitude correction.

The table 5a stores data for the correction of a phase of a signal together with a corresponding amplitude level of the signal. Therefore, when the digitized amplitude level outputted from the A/D converter 4 is inputted to the table 5a, corresponding data for phase correction are read from the table 5a to thereby be outputted to the D/A converter 6a. The D/A converter 6a converts the data for phase correction into an analog signal, the analog signal being inputted to the phase circuit 8 through the LPF 14a.

Meanwhile, the table 5b stores data for the correction of an amplitude of a signal together with a corresponding amplitude level of the signal. Therefore, when the digitized amplitude level outputted from the A/D converter 4 is inputted to the table 5b, corresponding data for amplitude correction are read from the table 5b to thereby be outputted to the D/A converter 6b. The D/A converter 6b converts the data for amplitude correction into an analog signal, the analog signal being inputted to the amplitude circuit 9 through the LPF 14b.

The branch signal, which is delivered from the branch circuit 1 to the phase circuit 8 through the delay circuit 2, is synchronized with the data for amplitude and phase correction outputted from the D/A converters 6a and 6b through the LPF's 14a and 14b.

Accordingly, in the phase circuit 8, the delayed branch signal inputted from the delay circuit 2 is distorted in its phase by using the data for phase correction from the D/A converter 6a. And then, in the amplitude circuit 9, the phase-distorted signal is distorted in its amplitude by using the date for amplitude correction from the D/A converter 6b.

The amplitude and phase distortion imposed on the delayed branch signal by the phase circuit 8 and the amplitude circuit 9 is subsequently inputted to the branch circuit 17.

A first output of the branch circuit 17 is inputted to the amplitude detector 16. The amplitude detector 16 extracts a difference frequency signal having a frequency of (f2−f1) from the first output to thereby output the difference frequency signal to the amplitude circuit 22. And then, the amplitude circuit 22 adjusts an amplitude of the difference frequency signal, which is inputted into the phase circuit 7. The phase circuit 7 converts a phase of the difference frequency signal to thereby output the phase-shifted difference frequency signal to the amplitude circuit 15.

A second output of the branch circuit 17 is coupled to the delay circuit 18. The delay circuit 18 delays the second output of the branch circuit 17 by as much time as required for a signal passing through the amplitude detector 16, the amplitude circuit 22 and the phase circuit 7. An output of the delay circuit 18 is coupled to the amplitude circuit 15. And then, the amplitude circuit 15 performs an amplitude modulation on the second output of the branch circuit 17 in accordance with the difference frequency signal. That is, by using the output of the phase circuit 7, the output being amplitude-adjusted and phase-shifted by the amplitude circuit 22 and the phase circuit 7, respectively, the amplitude circuit 15 generates higher and lower 3rd order distortions at the frequencies of (2·f1−f2) and (2·f2−f1), respectively, each of which has a reverse phase (i.e., a phase difference of 180°) with respect to a corresponding distortion generated by the main amplifier 10.

The signal amplified by the main amplifier 10 is outputted as a final output signal through the branch circuit 11. In this case, phase and amplitude distortions generated by the main amplifier 10 is cancelled by phase and amplitude distortions generated by the phase circuit 8 and the amplitude circuit 9 and sideband signals generated by the amplitude circuit 15.

Further, in the branch circuit 11, a part of the amplified signal from the main amplifier 10 is branched to the distortion detection circuit 12.

The distortion detection circuit 12 extracts a distortion component remaining in the branch signal from the branch circuit 11 after the distortion canceling being performed, the remaining distortion component being outputted to the table update circuit 13, the phase control circuit 19 and the modulation control circuit 23.

The table update circuit 13, based on the distortion component detected by the distortion detection circuit 12, calculates amplitude and phase correction data for further canceling the distortion component remaining in the branch signal from the branch circuit 11. Subsequently, the amplitude and phase correction data are stored into the tables 5a and 5b. In this way, the amplitude and phase correction data stored in the tables 5a and 5b are updated to minimize the amplitude and phase distortions caused by the amplifying device.

In the meanwhile, based on the distortion component detected by the distortion detection circuit 12, the phase control circuit 19 generates phase data for further canceling the distortion component remaining in the branch signal from the branch circuit 11. Subsequently, the phase data is inputted to the phase circuit 7 through the D/A converter 20. In this way, the control signal generated by the amplitude circuit 15 can be properly phase-shifted.

Further, based on the distortion component detected by the distortion detection circuit 12, the modulation control circuit 23 generates amplitude data for further canceling the distortion component remaining in the branch signal from the branch circuit 11. Subsequently, the amplitude data is inputted to the amplitude circuit 22 through the D/A converter 21. In this way, the control signal generated by the amplitude circuit 15 can be properly amplitude-modulated.

Through the update of the amplitude and phase correction data and the amplitude and phase modulation data by using the above-described feed-back system, the amplifying device can operate in an efficient manner regardless of any effect caused by, e.g., a temperature change or a secular change.

Here, the amplifying device may be implemented without the feed-back system including the branch circuit 11, the distortion detection circuit 12, the table update circuit 13, the phase control circuit 19, the modulation control circuit 23 and the D/A converters 20 and 21.

Further, the table 5a for phase correction and the D/A converter 6a can be configured in a single device. Also, the table 5b for amplitude correction and the D/A converter 6b can be configured in a single device.

Further, the phase circuit 8 and the amplitude circuit 9 can be coupled in a reverse order. That is, an output of the amplitude circuit 9 can be coupled to an input of the phase circuit 8.

Figure 13:
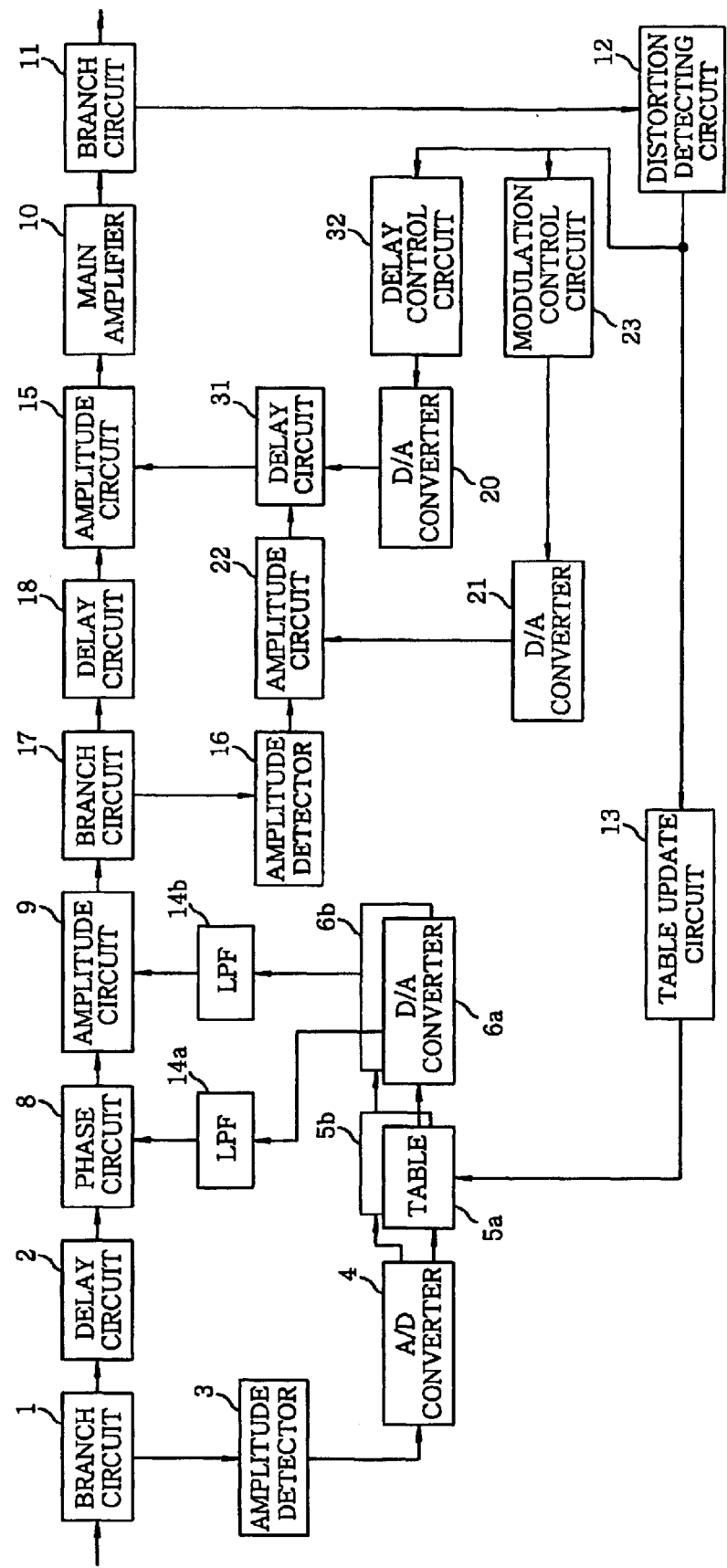
FIG. 13 exhibits another exemplary configuration of an amplifying device including the distortion compensation circuit in accordance with a second preferred embodiment of the present invention.

FIG. 13 illustrates another exemplary configuration of an amplifying device including a distortion compensation circuit adopting a pre-distortion canceling method in accordance with a second preferred embodiment of the present invention.

The amplifying device as shown in FIG. 13 includes a branch circuit 1, a delay circuit 2 (e.g., a delay line), an amplitude detector 3, an A/D converter 4, tables 5a and 5b for making corrections in a phase and an amplitude, two D/A converters 6a and 6b, two LPF's 14a and 14b, a phase circuit 8 for controlling a phase of a main signal, an amplitude circuit 9 for controlling an amplitude of the main signal, another branch circuit 17, another amplitude detector 16, another amplitude circuit 22, another delay circuit 31 (e.g., a delay line), still another delay circuit 18 for delaying the main signal, still another amplitude circuit 15, a main amplifier 10, still another branch circuit 11, a distortion detection circuit 12, a table update circuit 13, a delay control circuit 32 for adjusting a delay of a control signal for the amplitude circuit 15, a modulation control circuit 23 for adjusting an amplitude of the control signal for the amplitude circuit 15, another two D/A converters 20 and 21 for converting an output of the delay control circuit 32 and the modulation control circuit 23, respectively, into an analog signal. Here, the amplitude detectors 3 and 16 can use a square-law detection method or any other method as long as it can detect an envelope component of a signal. Further, in order to remove a high-frequency component of an output of the amplitude detectors 3 and 16, an LPF may be added to the output thereof.

The amplifying device shown in FIG. 13 has the same configuration and operates in the same way as that of FIG. 12 except the following points. That is, the amplifying device of FIG. 13 includes the delay circuit 31, instead of the phase circuit 7, between the amplitude circuits 22 and 15. Further, the amplifying device includes the delay control circuit 32, instead of the phase control circuit 19, between the distortion detection circuit 12 and the D/A converter 20.

In this exemplary configuration, the delay circuit 31 performs the same operation as the phase circuit 7 as shown in FIG. 12 by delaying an analog signal outputted from the amplitude circuit 22. Further, based on the output of the distortion detection circuit 12, the delay control circuit 32 performs the same feed-back operation as the phase control circuit 19 as shown in FIG. 12. Accordingly, compared to the prior art, the amplifying device of FIG. 13 has the same advantageous effects as that of FIG. 12.

Figure 14:
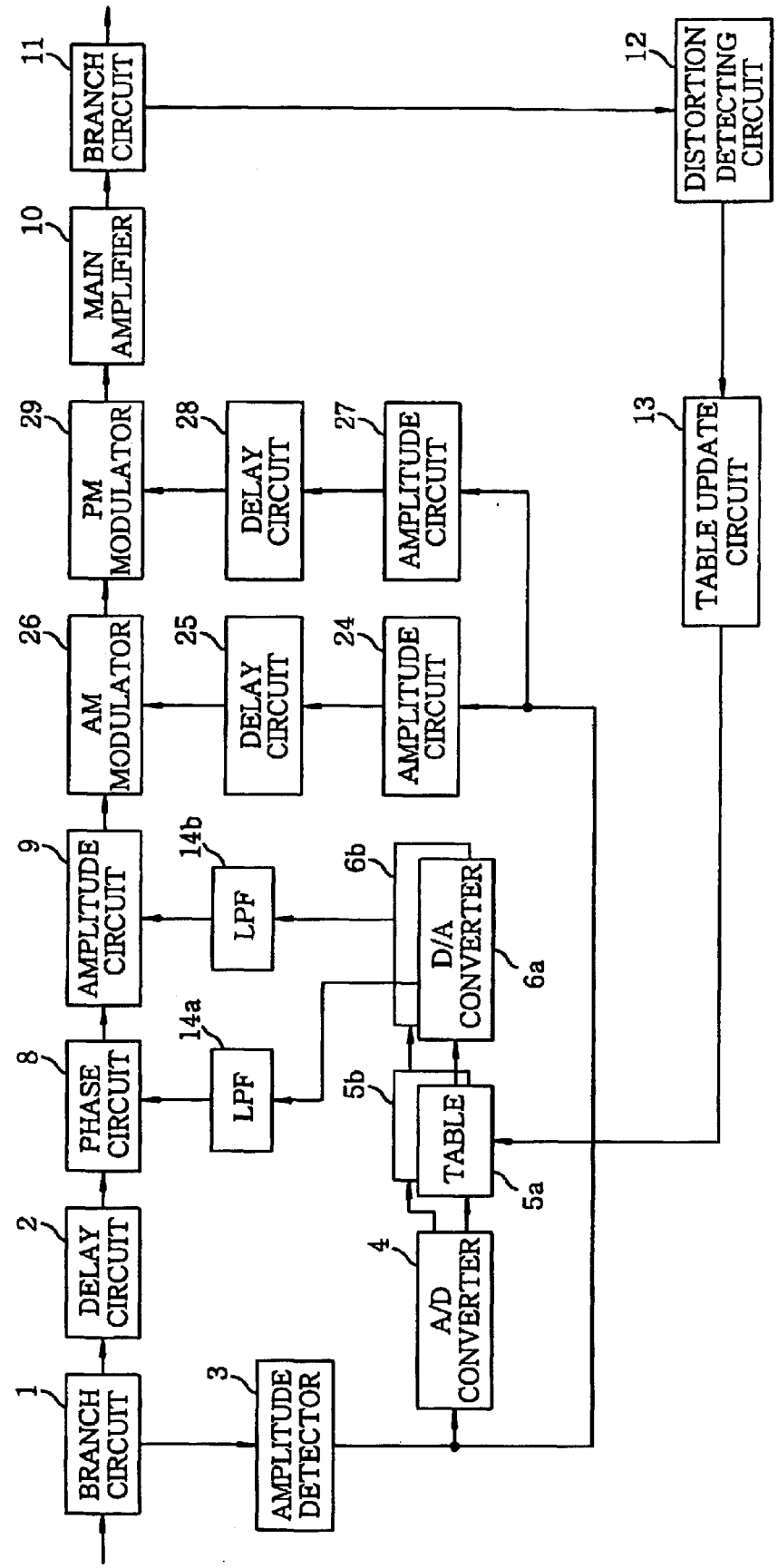
FIG. 14 describes still another exemplary configuration of an amplifying device including a distortion compensation circuit in accordance with a third preferred embodiment of the present invention.

FIG. 14 illustrates still another exemplary configuration of an amplifying device including a distortion compensation circuit adopting a pre-distortion canceling method in accordance with a third preferred embodiment of the present invention.

The amplifying device includes a branch circuit 1, a delay circuit 2 (e.g., delay line), an amplitude detector 3, an A/D converter 4, tables 5a and 5b for the correction of a phase and an amplitude, two D/A converters 6a and 6b, two LPF's 14a and 14b, a phase circuit 8 for controlling a phase of a main signal, an amplitude circuit 9 for controlling an amplitude of the main signal, another amplitude circuit 24 for controlling an amplitude modulation, another delay circuit 25 for controlling an amplitude modulation, still another amplitude circuit 27 for controlling a phase modulation, still another delay circuit 28 for controlling a phase modulation, an AM modulator 26 for performing an AM on the main signal, a PM modulator 29 for performing a PM on the main signal, a main amplifier 10, another branch circuit 11, a distortion detection circuit 12 and a table update circuit 13.

Here, the amplitude detector 3 can use a square-law detection method or any other method on the condition that it detects an envelope component of a signal Further, in order to remove a high-frequency component of an output of the amplitude detector 3, an LPF may be added to the output thereof.

The branch circuit 1 outputs an RF signal having frequencies of f1 and f2 to the phase circuit 8 as an input signal thereof through the delay circuit 2. At the same time, a part of the RF signal from the branch circuit 1 is outputted to the amplitude detector 3.

The amplitude detector 3 performs amplitude detection on the RF signal from the branch circuit 1, to thereby output the detected amplitude to the A/D converter 4 and the amplitude circuits 24 and 27.

The A/D converter 4 converts the detected amplitude into a digital signal. The digital signal is inputted to the table 5a for phase correction and the table 5b for amplitude correction.

The table 5a stores data for the correction of a phase of a signal together with a corresponding amplitude level of the signal. Therefore, when the digitized amplitude level outputted from the A/D converter 4 is inputted to the table 5a, corresponding data for phase correction are read from the table 5a to thereby be outputted to the D/A converter 6a. The D/A converter 6a converts the data for phase correction into an analog signal, the analog signal being inputted to the phase circuit 8 through the LPF 14a.

Meanwhile, the table 5b stores data for the correction of an amplitude of a signal together with a corresponding amplitude level of the signal. Therefore, when the digitized amplitude level outputted from the A/D converter 4 is inputted to the table 5b, corresponding data for amplitude correction are read from the table 5b to thereby be outputted to the D/A converter 6b. The D/A converter 6b converts the data for amplitude correction into an analog signal, the analog signal being inputted to the amplitude circuit 9 through the LPF 14b.

The branch signal, which is delivered from the branch circuit 1 to the phase circuit 8 through the delay circuit 2, is synchronized with the data for phase correction outputted from the D/A converter 6a through the LPF 14a. Also, the phase-shifted branch signal, which is outputted from the phase circuit 8 to the amplitude circuit 9, is synchronized with the data for amplitude correction outputted from the D/A converter 6b through the LPF 14b.

Accordingly, in the phase circuit 8, the delayed branch signal inputted from the delay circuit 2 is distorted in its phase by using the data for phase correction from the D/A converter 6a. And then, in the amplitude circuit 9, the phase-distorted signal is distorted in its amplitude by using the data for amplitude correction from the D/A converter 6b.

The amplitude and phase distortion imposed on the delayed branch signal by the phase circuit 8 and the amplitude circuit 9 is subsequently inputted to the AM modulator 26.

Here, the phase circuit 8 and the amplitude circuit 9 can be implemented by using, e.g., a variable phase converter and a variable attenuator, respectively.

Meanwhile, based on the detected amplitude from the amplitude detector 3, the amplitude circuit 24 obtains a signal having a frequency of (f2−f1). The amplitude of the signal having the frequency of (f2−f1) is adjusted by the amplitude circuit 24 and then is inputted to the delay circuit 25. And then, the delay circuit 25 imposes a delay on the signal having the frequency of (f2−f1). The delayed signal is inputted to a control terminal of the AM modulator 26.

Here, the delayed signal having the frequency of (f2−f1) corresponds to the control signal of the present invention to be used in an AM. That is, the amplitude of the control signal is adjusted by the amplitude circuit 24, which results in an adjustment of the modulation coefficient. Further, the delay time of the control signal is adjusted by the delay circuit 25.

Likewise, based on the detected amplitude from the amplitude detector 3, the amplitude circuit 27 obtains a signal having a frequency of (f2−f1). The amplitude of the signal having the frequency of (f2−f1) is adjusted by the amplitude circuit 27 and then is inputted to the delay circuit 28. And then, the delay circuit 28 imposes a delay on the signal having the frequency of (f2−f1). The delayed signal is inputted to a control terminal of the PM modulator 29.

Here, the delayed signal having the frequency of (f2−f1) corresponds to the control signal of the present invention to be used in a PM. That is, the amplitude of the control signal is adjusted by the amplitude circuit 27, which results in an adjustment of the modulation coefficient. Further, the delay time of the control signal is adjusted at the delay circuit 28.

The AM modulator 26 performs an AM on the signal inputted from the amplitude circuit 9 in accordance with the control signal applied from the delay circuit 25, to thereby output the AM-modulated signal to the PM modulator 29.

Subsequently, the PM modulator 29 performs a PM on the signal inputted from the AM modulator 26 in accordance with the control signal applied from the delay circuit 28, to thereby output the PM-modulated signal to the main amplifier 10.

In this exemplary configuration, the delay time which the delay circuits 25 and 28 impose on the signal may be varied. For instance, the delay times generated by the delay circuits 25 and 28 are assumed to be T1 and T2, respectively. In this case, T1 is set such that a signal inputted to the AM modulator 26 through the branch circuit 1, the delay circuit 2, the phase circuit 8 and the amplitude circuit 9 is synchronized with that inputted to the control terminal of the AM modulator 26 through the branch circuit 1, the amplitude detector 3, the amplitude circuit 24 and the delay circuit 25. Further, T2 is set such that a signal inputted to the PM modulator 29 through the branch circuit 1, the delay circuit 2, the phase circuit 8, the amplitude circuit 9 and the AM modulator 26 is synchronized with that inputted to the control terminal of the PM modulator 29 through the branch circuit 1, the amplitude detector 3, the amplitude circuit 27 and the delay circuit 28.

Here, T1 or T2 can be varied such that phases of distortions generated by the AM modulator 26 and the PM modulator 29 are also varied. Further, amplitudes of the control signals are adjusted by the amplitude circuit 24 and 27, such that the modulation coefficients of the AM and PM performed by the AM modulator 26 and the PM modulator 29 are adjusted. In this way, amplitudes of sideband signals generated by the AM modulator 26 and the PM modulator 29 can be varied.

As described above, the AM modulator 26 and the PM modulator 29 are positioned after the phase circuit 8 and the amplitude circuit 9. However, the AM modulator 26 and the PM modulator 29 may be positioned before the phase circuit 8 and the amplitude circuit 9.

Further, the phase circuit 8 and the amplitude circuit 9 can be coupled in a reverse order. That is, an output of the amplitude circuit 9 can be coupled to an input of the phase circuit 8.

Furthermore, the phase circuit 8, the amplitude circuit 9, the AM modulator 26 and the PM modulator 29 can be coupled in series in a different order.

The signal amplified by the main amplifier 10 is outputted as a final output signal through the branch circuit 11. In this case, phase and amplitude distortions generated by the main amplifier 10 are cancelled by phase and amplitude distortions generated by the phase circuit 8 and the amplitude circuit 9 and sideband signals generated by the AM modulator 26 and the PM modulator 29. Further, in the branch circuit 11, a part of the amplified signal from the main amplifier 10 is branched to the distortion detection circuit 12.

The distortion detection circuit 12 extracts a distortion component remaining in the branch signal from the branch circuit 11 after the distortion canceling, the remaining distortion component being outputted to the table update circuit 13.

The table update circuit 13, based on the distortion component detected by the distortion detection circuit 12, calculates amplitude and phase correction data for further canceling the distortion component remaining in the branch signal from the branch circuit 11. Subsequently, the amplitude and phase correction data are stored in the tables 5a and 5b. In this way, the amplitude and phase correction data stored in the tables 5a and 5b are updated to minimize the amplitude and phase distortions caused by the amplifying device.

Through the update of the amplitude and phase correction data by using the above described feed-back system, the amplifying device can operate in an efficient manner regardless of any effect caused by, e.g., a temperature change or a secular change.

Here, the amplifying device may be implemented without the feed-back system including the branch circuit 11, the distortion detection circuit 12 and the table update circuit 13.

Further, the table 5a for phase correction and the D/A converter 6a can be configured in a single device. Also, the table 5b for amplitude correction and the D/A converter 6b can be configured in a single device.

As described above, by using the sideband signals generated through AM and PM performed by the AM modulator 26 and the PM modulator 29, one of the distortions at the frequencies of (2·f2−f1) and (2·f1−f2) introduced by the main amplifier 10 can be canceled at the amplifying device. In this way, compared to the prior art, a large amount of the distortion canceling can be achieved at the amplifying device, to thereby increase the linearization of the amplifying device.

Further, by using the sideband signals generated by the AM modulator 26 and the PM modulator 29 together with the sideband signals generated by the phase circuit 8 and the amplitude circuit 9, the distortions at the frequencies of (2·f2−f1) and (2·f1−f2) introduced by the main amplifier 10 can be canceled at the amplifying device. In this way, compared to the prior art, the amplifying device can perform a more precise distortion canceling.

Figure 15:
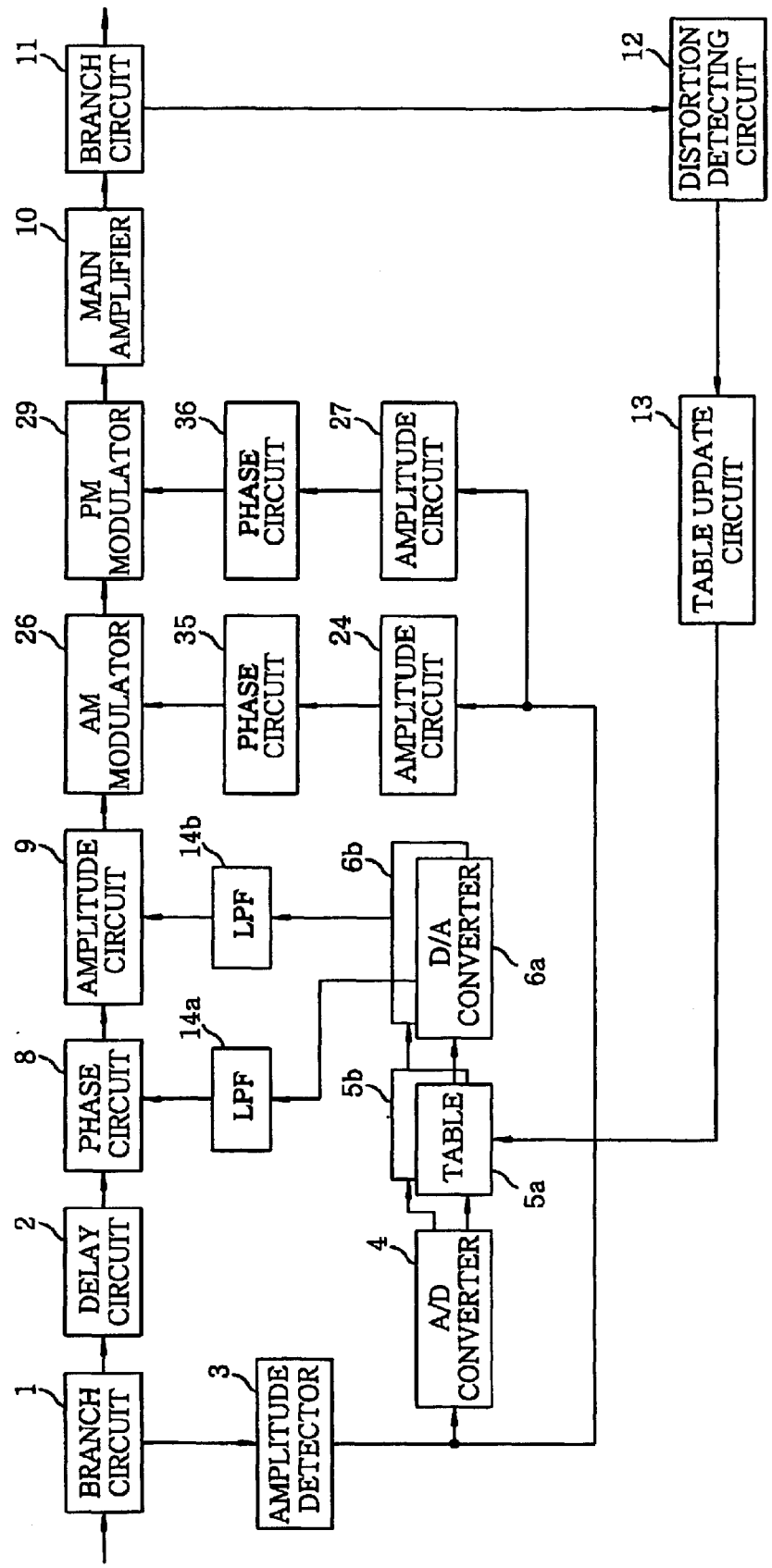
FIG. 15 shows still another exemplary configuration of an amplifying device including the distortion compensation circuit in accordance with a fourth preferred embodiment of the present invention.

FIG. 15 illustrates still another exemplary configuration of an amplifying device including a distortion compensation circuit adopting a pre-distortion canceling method in accordance with a fourth preferred embodiment of the present invention.

The amplifying device includes a branch circuit 1, a delay circuit 2 (e.g., delay line), an amplitude detector 3, an A/D converter 4, tables 5a and 5b for the correction of a phase and an amplitude, two D/A converters 6a and 6b, two LPF's 14a and 14b, a phase circuit 8 for controlling a phase of a main signal, an amplitude circuit 9 for controlling an amplitude of the main signal, another amplitude circuit 24 for controlling an amplitude modulation, another phase circuit 35 for controlling an amplitude modulation, still another amplitude circuit 27 for controlling a phase modulation, still another phase circuit 36 for controlling a phase modulation, an AM modulator 26 for performing an AM on the main signal, a PM modulator 29 for performing a PM on the main signal, a main amplifier 10, another branch circuit 11, a distortion detection circuit 12 and a table update circuit 13

The amplifying device shown in FIG. 15 has the same configuration and operates in the same way as that of FIG. 14 except the following points. That is, the amplifying device of FIG. 15 includes the phase circuit 35, instead of the delay circuit 25, between the amplitude circuit 24 and the AM modulator 26. Further, the amplifying device includes the phase circuit 36, instead of the delay circuit 28, between the amplitude circuit 27 and the PM modulator 29.

In this exemplary configuration, the phase circuits 35 and 36 perform the same operation as the delay circuits 25 and 28 of FIG. 14 by delaying an analog signal outputted from the amplitude circuits 24 and 27, respectively.

Figure 16:
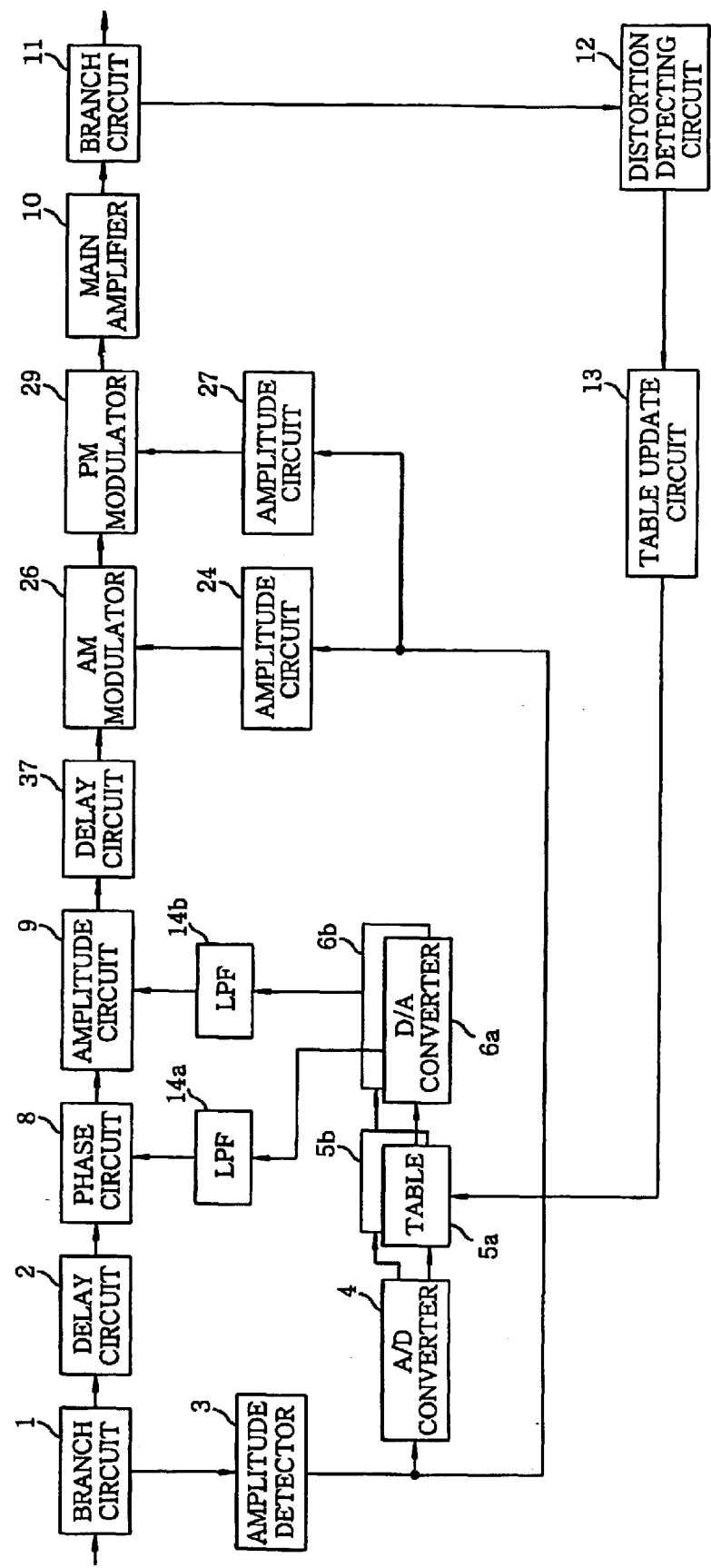
FIG. 16 depicts still another exemplary configuration of an amplifying device including the distortion compensation circuit in accordance with a fifth preferred embodiment of the present invention.

FIG. 16 illustrates still another exemplary configuration of an amplifying device including a distortion compensation circuit adopting a pre-distortion canceling method in accordance with a fifth preferred embodiment of the present invention.

The amplifying device includes a branch circuit 1, a delay circuit 2 (e.g., delay line), an amplitude detector 3, an A/D converter 4, tables 5a and 5b for the correction of a phase and an amplitude, two D/A converters 6a and 6b, two LPF's 14a and 14b, a phase circuit 8 for controlling a phase of a main signal, an amplitude circuit 9 for controlling an amplitude of the main signal, another delay circuit 37 for delaying the main signal, another amplitude circuit 24 for controlling an amplitude modulation, still another amplitude circuit 27 for controlling a phase modulation, an AM modulator 26 for performing an AM on the main signal, a PM modulator 29 for performing a PM on the main signal, a main amplifier 10, another branch circuit 11, a distortion detection circuit 12 and a table update circuit 13

The amplifying device shown in FIG. 16 has the same configuration and operates in the same way as that of FIG. 14 except the following points. That is, the amplifying device of FIG. 16 is configured without the delay circuits 25 and 28. Further, the amplifying device includes the delay circuit 37 between the amplitude circuit 9 and the AM modulator 26.

In this exemplary configuration, the delay circuit 37 delays a signal inputted from the amplitude circuit 9. And then, the delayed signal is inputted to the AM modulator 26.

In this way, the amplifying device can vary a phase difference between the main signal modulated by the AM modulator 26 and the PM modulator 29 and the control signal of the AM modulator 26 or the PM modulator 29. This means that phases of the control signals to be used in AM and PM performed by the AM modulator 26 and the PM modulator 29 can be actually adjusted.

As mentioned above, although the amplifying devices of the present invention are described to perform a distortion canceling on a signal having two frequencies of f1 and f2, the present invention can be applied in case of a signal having more than two frequencies.

The application area of the distortion compensation circuit of the present invention is not limited to those describe above. For instance, an amplifying device including the distortion compensation circuit in accordance with the present invention is suitable for use in a transmitter for transmitting a signal, e.g., a W-CDMA signal or a multi-carrier signal.

The amplifying device in accordance with the present invention can be configured to have hardware resources including a processor and a memory wherein the processor executes a control program stored in the memory (ROM) to control the amplifying device. Further, the elements of the amplifying device can be configured as an independent hardware circuit.

The control program can be stored in a storage medium, such as a floppy disk or a CD-ROM, which can be readable by a computer. In this case, the control program is loaded to the memory from the storage media to be executed by the processor.

While the invention has been shown and described with respect to the preferred embodiments, it will be understood by those skilled in the art that various changes and modifications may be made without departing from the spirit and scope of the invention as defined in the following claims.

What is claimed is:

1. A distortion compensation circuit for reducing an unbalance between a higher 3rd order distortion and a lower 3rd order distortion generated by an amplifier which amplifies an input signal having at least two frequency components, the distortion compensation circuit comprising:

amplitude modulation means for performing an amplitude modulation on the input signal by using a control signal having a frequency corresponding to a difference between the frequency components, wherein the distortion compensation circuit cancels the unbalance by using sideband signals generated as a result of the amplitude modulation performed by the amplitude modulation means and the amplitude modulation means includes control signal generating means for generating the control signal based on an envelope of the input signal; amplitude adjusting means for adjusting an amplitude of the control signal; phase adjusting means for adjusting a phase of the control signal; and amplitude modulation performing means for performing an amplitude modulation on the input signal based on the control signal to thereby generate the sideband signals.

2. A distortion compensation circuit for reducing an unbalance between a higher 3rd order distortion and a lower 3rd order distortion generated by an amplifier which amplifies an input signal having at least two frequency components, the distortion compensation circuit comprising:

amplitude modulation means for performing an amplitude modulation on the input signal by using a control signal having a frequency corresponding to a difference between the frequency components;

distortion level detecting means for detecting levels of higher and lower 3rd order distortions included in the input signal after the distortion canceling being performed; and sideband signal adjusting means for adjusting the sideband signals generated by the amplitude modulation means to thereby reduce a difference between the levels, wherein the distortion compensation circuit cancels the unbalance by using sideband signals generated as a result of the amplitude modulation performed by the amplitude modulation means.

3. The distortion compensation circuit of claim 1, further comprising:

distortion level detecting means for detecting levels of higher and lower 3rd order distortions included in the input signal after the distortion canceling being performed; and sideband signal adjusting means for adjusting the sideband signals generated by the amplitude modulation means to thereby reduce a difference between the levels.

4. An amplifying device adopting a pre-distortion canceling method, the amplifying device comprising:

a distortion compensation circuit as described in claim 2.

5. The amplifying device of claim 4, further comprising:

distortion level detecting means for detecting levels of higher and lower 3rd order distortions included in the input signal after the distortion canceling being performed; and sideband signal adjusting means for adjusting the sideband signals generated by the amplitude modulation means to thereby reduce a difference between the levels.

6. An amplifying device adopting a pre-distortion canceling method, the amplifying device comprising:

a distortion compensation circuit as described in claim 1.

7. The amplifying device of claim 6, further comprising:

distortion level detecting means for detecting levels of higher and lower 3rd order distortions included in the input signal after the distortion canceling being performed; and sideband signal adjusting means for adjusting the sideband signals generated by the amplitude modulation means to thereby reduce a difference between the levels.

8. A distortion compensation circuit for reducing an unbalance between a higher 3rd order distortion and a lower 3rd order distortion generated by an amplifier which amplifies an input signal having at least two frequency components, the distortion compensation circuit comprising:

amplitude modulation means for performing an amplitude modulation on the input signal by using a control signal having a frequency corresponding to a difference between the frequency components; and phase modulation means for performing a phase modulation on the input signal by using a control signal having a frequency corresponding to a difference between the frequency components, wherein the distortion compensation circuit cancels the unbalance by using sideband signals generated as a result of the amplitude and phase modulations performed by the amplitude modulation means and the phase modulation means and the amplitude modulation means includes control signal generating means for generating the control signal based on an envelope of the input signal; amplitude adjusting means for adjusting an amplitude of the control signal; phase adjusting means for adjusting a phase of the control signal; and amplitude modulation performing means for performing an amplitude modulation on the input signal based on the control signal to thereby generate the sideband signals.

9. A distortion compensation circuit for reducing an unbalance between a higher 3rd order distortion and a lower 3rd order distortion generated by an amplifier which amplifies an input signal having at least two frequency components, the distortion compensation circuit comprising:

amplitude modulation means for performing an amplitude modulation on the input signal by using a control signal having a frequency corresponding to a difference between the frequency components; and phase modulation means for performing a phase modulation on the input signal by using a control signal having a frequency corresponding to a difference between the frequency components, wherein the distortion compensation circuit cancels the unbalance by using sideband signals generated as a result of the amplitude and phase modulations performed by the amplitude modulation means and the phase modulation means and the phase modulation means includes control signal generating means for generating a control signal based on an envelope of the input signal; amplitude adjusting means for adjusting an amplitude of the control signal; phase adjusting means for adjusting a phase of the control signal; and phase modulation performing means for performing a phase modulation on the input signal based on the control signal to thereby generate the sideband signal.

10. A distortion compensation circuit for reducing an unbalance between a higher 3rd order distortion and a lower 3rd order distortion generated by an amplifier which amplifies an input signal having at least two frequency components, the distortion compensation circuit comprising:

amplitude modulation means for performing an amplitude modulation on the input signal by using a control signal having a frequency corresponding to a difference between the frequency components; and phase modulation means for performing a phase modulation on the input signal by using a control signal having a frequency corresponding to a difference between the frequency components, distortion level detecting means for detecting levels of higher and lower 3rd order distortions included in the input signal after the distortion canceling being performed; and sideband signal adjusting means for adjusting the sideband signals generated by the amplitude modulation means and the phase modulation means to thereby reduce a difference between the levels, wherein the distortion compensation circuit cancels the unbalance by using sideband signals generated as a result of the amplitude and phase modulations performed by the amplitude modulation means and the phase modulation means.

11. The distortion compensation circuit of claim 8, further comprising:

distortion level detecting means for detecting levels of higher and lower 3rd order distortions included in the input signal after the distortion canceling being performed; and sideband signal adjusting means for adjusting the sideband signals generated by the amplitude modulation means and the phase modulation means to thereby reduce a difference between the levels.

12. The distortion compensation circuit of claim 9, further comprising:

distortion level detecting means for detecting levels of higher and lower 3rd order distortions included in the input signal after the distortion canceling being performed; and sideband signal adjusting means for adjusting the sideband signals generated by the amplitude modulation means and the phase modulation means to thereby reduce a difference between the levels.

13. An amplifying device adopting a pre-distortion canceling method, the amplifying device comprising:

a distortion compensation circuit as described in claim 10.

14. The amplifying device of claim 13, further comprising:

distortion level detecting means for detecting levels of higher and lower 3rd order distortions included in the input signal after the distortion canceling being performed; and sideband signal adjusting means for adjusting the sideband signals generated by the amplitude modulation means and the phase modulation means to thereby reduce a difference between the levels.

15. An amplifying device adopting a pre-distortion canceling method, the amplifying device comprising:

a distortion compensation circuit as described in claim 8.

16. The amplifying device of claim 15, further comprising:

distortion level detecting means for detecting levels of higher and lower 3rd order distortions included in the input signal after the distortion canceling being performed; and sideband signal adjusting means for adjusting the sideband signals generated by the amplitude modulation means and the phase modulation means to thereby reduce a difference between the levels.

17. An amplifying device adopting a pre-distortion canceling method, the amplifying device comprising:

a distortion compensation circuit as described in claim 9.

18. The amplifying device of claim 17, further comprising:

distortion level detecting means for detecting levels of higher and lower 3rd order distortions included in the input signal after the distortion canceling being performed; and sideband signal adjusting means for adjusting the sideband signals generated by the amplitude modulation means and the phase modulation means to thereby reduce a difference between the levels.

* * * * *